US012783070B2

(12) United States Patent
Lee et al.

(10) Patent No.: US 12,783,070 B2
(45) Date of Patent: Nov. 3, 2026

(54) DISPLAY DEVICE

(71) Applicant: LG Display Co., Ltd., Seoul (KR)

(72) Inventors: Sul Lee, Paju-si (KR); Jonghyeok Lim, Paju-si (KR); Hyoungsu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/643,801

(22) Filed: Apr. 23, 2024

(65) Prior Publication Data

US 2024/0276792 A1 Aug. 15, 2024

Related U.S. Application Data

(62) Division of application No. 17/526,733, filed on Nov. 15, 2021, now Pat. No. 12,004,379.

(30) Foreign Application Priority Data

Nov. 30, 2020 (KR) ........................ 10-2020-0164261

(51) Int. Cl.
*G06F 3/044* (2006.01)
*G06F 3/041* (2006.01)
(Continued)

(52) U.S. Cl.
CPC ........ *G06F 3/0412* (2013.01); *G06F 3/04164* (2019.05); *G06F 3/0448* (2019.05);
(Continued)

(58) Field of Classification Search
CPC ........... G02F 1/13338; G02F 1/134345; G06F 3/0412; G06F 3/04164; G06F 3/0444;
(Continued)

(56) References Cited

U.S. PATENT DOCUMENTS 10,418,424 B2 9/2019 Oh et al.
2013/0038569 A1* 2/2013 Kim ..................... G06F 3/0412 345/174

(Continued)

FOREIGN PATENT DOCUMENTS

KR 10-2018-0049326 A 5/2018
KR 10-2089340 B1 3/2020

(Continued)

*Primary Examiner* — Julie Anne Watko

(74) *Attorney, Agent, or Firm* — Birch, Stewart, Kolasch & Birch, LLP

(57) ABSTRACT

A display device can include light emitting parts corresponding to pixel electrodes located in a display area; a plurality of transmission parts, each disposed among the light emitting parts adjacent to each other; and a touch metal including first touch metals extending in a first direction and second touch metals extending in a second direction on the pixel electrodes. Also, each of the pixel electrodes includes sub-pixel electrodes, and each of which is divided into parts, and a portion of the first touch metals is disposed between the divided parts of the sub-pixel electrode, and the other portion of the first touch metals is disposed between the sub-pixel electrodes disposed adjacently to each other in the second direction, and the second touch metals are disposed between the sub-pixel electrodes disposed adjacently to each other in the first direction.

13 Claims, 18 Drawing Sheets

B

(51) Int. Cl.

| | |
|---|---|
| ***H10K 59/121*** | (2023.01) |
| ***H10K 59/123*** | (2023.01) |
| ***H10K 59/131*** | (2023.01) |
| ***H10K 59/35*** | (2023.01) |
| *H10K 59/12* | (2023.01) |
| *H10K 59/40* | (2023.01) |

(52) U.S. Cl.
CPC ......... *H10K 59/121* (2023.02); *H10K 59/123* (2023.02); *H10K 59/131* (2023.02); *H10K 59/353* (2023.02); *G06F 3/0446* (2019.05); *H10K 59/12* (2023.02); *H10K 59/351* (2023.02); *H10K 59/40* (2023.02)

(58) Field of Classification Search
CPC ................. G06F 3/0446; G06F 3/0448; G06F 2203/04111; H10K 50/8426; H10K 50/844; H10K 59/12; H10K 59/121; H10K 59/1213; H10K 59/123; H10K 59/131; H10K 59/35; H10K 59/351; H10K 59/353; H10K 59/40
See application file for complete search history.

(56) References Cited

U.S. PATENT DOCUMENTS

2014/0352143 A1 12/2014 Cok
2015/0198837 A1* 7/2015 Kim .................. G02F 1/133707 438/30
2016/0202585 A1* 7/2016 Jung ................... G02F 1/13624 349/43
2016/0282987 A1 9/2016 Choi et al.
2018/0188867 A1 7/2018 Yeh
2018/0190935 A1* 7/2018 Kim ..................... H10K 59/122
2019/0302935 A1 10/2019 Clark et al.
2019/0302959 A1 10/2019 Clark et al.
2020/0004363 A1 1/2020 Yang et al.
2020/0111858 A1* 4/2020 Lee ...................... H10K 59/121
2020/0133083 A1* 4/2020 Chun ................ G02F 1/136227
2020/0257404 A1 8/2020 Van Ostrand et al.
2021/0384481 A1* 12/2021 Sun ...................... H10K 59/131
2021/0397305 A1 12/2021 Cho et al.
2021/0408163 A1* 12/2021 Heo ................... H10K 59/8723
2022/0208887 A1* 6/2022 Yoon .................... H10K 59/122
2022/0398012 A1 12/2022 Gray et al.

FOREIGN PATENT DOCUMENTS

KR 10-2092547 B1 3/2020
KR 10-2100881 B1 4/2020
KR 10-2020-0081980 A 7/2020

* cited by examiner

DISPLAY DEVICE

CROSS-REFERENCE TO RELATED APPLICATION

The present application is a Divisional of U.S. application Ser. No. 17/526,733, filed on Nov. 15, 2021, which claims priority to Korean Patent Application No. 10-2020-0164261, filed in the Republic of Korea on Nov. 30, 2020, the entire contents of all these applications are hereby expressly incorporated by reference into the present application.

FIELD

The present disclosure relates generally to a display device. More particularly, the present disclosure relates to the structures of a pixel and a touch electrode for improving the transmittance of a display device.

BACKGROUND

Following a liquid crystal display device (LCD) that has been used up to now, the use and application range of an organic light emitting display device (OLED) is gradually increasing.

In display devices, a plurality of light emitting diodes or liquid crystals is disposed on a substrate of the display device to display an image, and a driving element is disposed on the substrate to individually control the operation of each of the light emitting diodes or the liquid crystals such that the plurality of light emitting diodes or liquid crystals disposed on the substrate displays desired information on the substrate.

Since the liquid crystal display device is not self-luminous, a light source, such as a backlight is needed, which can be disposed on the rear surface of the liquid crystal display device to emit light. The backlight can increase the thickness of the liquid crystal display device, and thus there can be a limitation in embodying the display device which needs to be flexible or has various design needs such as circular shapes. As a result, the luminance and response speed of the display device can be reduced.

On the other hand, a display device having a self-light emitting diode can be configured to be thinner than the display device having a light source provided therein, and thus can be configured to be flexible and foldable. The display device having the self-light emitting diode can include an organic light emitting display device containing an organic material as an active layer. The organic light emitting display device is self-luminous and does not require a separate light source and has a transmission part, which is an area in which the light emitting diode is not disposed, so the organic light emitting display device can be used as a transparent display device through which a background can be seen.

In addition, a touch-based input function that allows a user to easily and intuitively and conveniently input information or commands can be applied to the transparent display device. In order to provide the touch-based input function to the transparent display device, touch metals/layers constituting a touch electrode and a touch routing wire are needed to be formed on a display panel. A portion of such touch metals are disposed in the transmission part of the transparent display device, which can decrease the transmittance thereof. In a case in which a portion of the touch metals are removed to increase the transmittance, the touch sensitivity of the display device can be decreased.

SUMMARY OF THE INVENTION

Accordingly, the present disclosure has been made to address the above and limitations associated with the related art, and the present disclosure is intended to improve the transmittance and touch sensitivity of a display device.

In addition, the present specification is intended to prevent or minimize the display quality of the display device from being reduced when a sub-pixel of the display device is damaged.

Furthermore, the objectives of the present specification are not limited to the objectives mentioned above, and other objectives not mentioned will be clearly understood by those skilled in the art from the following description.

In order to achieve one of the above objectives, a display device according to an embodiment of the present disclosure includes a plurality of light emitting parts disposed to correspond to a plurality of pixel electrodes disposed in a display area, and a transmission part disposed at a side of each of the plurality of light emitting parts, and can further include a touch metal including a plurality of first touch metals extending in a first direction and a plurality of second touch metals extending in a second direction on the plurality of pixel electrodes. In addition, each of the plurality of pixel electrodes comprises a plurality of sub-pixel electrodes, and each of the plurality of sub-pixel electrodes can be divided into a plurality of parts by a portion of the plurality of first touch metals.

The display device according to an embodiment of the present disclosure can include a plurality of light emitting parts disposed to correspond a plurality of pixel electrodes disposed in a display area; a transmission part disposed at a side of each of the plurality of light emitting parts; and a touch metal including a plurality of first touch metals extending in a first direction and a plurality of second touch metals extending in a second direction on the plurality of pixel electrodes. In addition, each of the plurality of pixel electrodes can be composed of a plurality of sub-pixel electrodes, and a portion of the plurality of first touch metals can overlap and be disposed on the plurality of sub-pixel electrodes. The details of other embodiments are included in the detailed description below and the accompanying drawings.

According to an embodiment of the present disclosure, the sub-pixel electrode is divided into a plurality of parts, and the touch metal is disposed between the divided plurality of parts, thereby improving the transmittance and touch sensitivity of the display device.

According to an embodiment of the present disclosure, the display device includes a sub-pixel connecting part connecting sub-pixel electrodes, each of which is divided into a plurality of parts, to each other, and includes a repair part protruding from the sub-pixel connecting part, thereby enabling the repair of the sub-pixel when the sub-pixel is damaged and improving the display quality of the display device.

BRIEF DESCRIPTION OF THE DRAWINGS

The above and other objectives, features, and other advantages of the present disclosure will be more clearly understood from the following detailed description when taken in conjunction with the accompanying drawings.

DETAILED DESCRIPTION OF THE EMBODIMENTS

Figure 1:
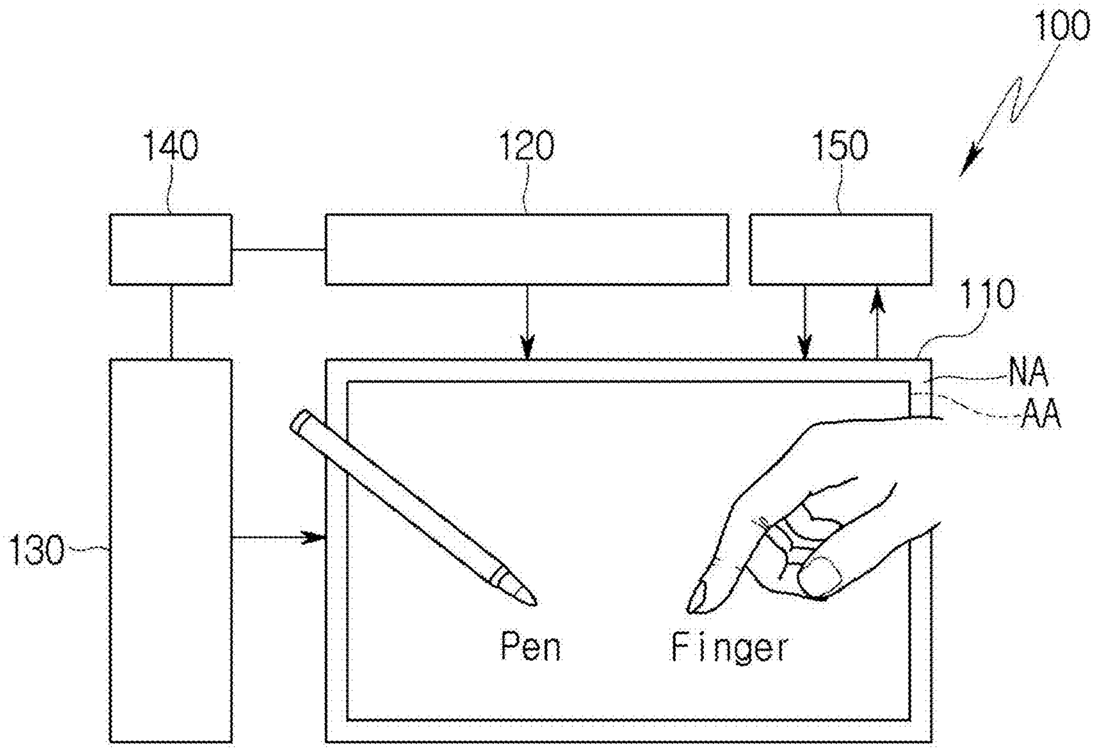
FIG. 1 is a system configuration diagram of a display device according to a first embodiment of the present disclosure.

Specific details for carrying out the present disclosure will become apparent with reference to the embodiments described below in conjunction with the drawings. However, the present disclosure is not limited to the embodiments disclosed below, but will be implemented in various different forms, and only the embodiments allow the disclosure of the present specification to be complete, and are intended to completely inform those skilled in the art to which the present disclosure pertains of the scope of the invention. The present disclosure is only defined by the scope of the claims.

The shapes, sizes, proportions, angles, numbers, etc. disclosed in the drawings for explaining the embodiments of the present disclosure are illustrative and the present disclosure is not limited to the illustrated matters. Like reference numerals refer to like elements throughout the specification. In addition, in describing the present disclosure, if it is determined that a detailed description of a related known technology can unnecessarily obscure the subject matter of the present disclosure, the detailed description thereof will be omitted. When “including”, “having”, and “consisting”, etc. mentioned in this specification are used, other parts can be added unless “only” is used. When a component is expressed in a singular form, a case in which a plurality of components is included is included unless specifically stated otherwise.

In interpreting components, it is interpreted as including an error range even if there is no separate explicit description.

In the case of a description of a positional relationship, for example, if the positional relationship of two parts is described by using “on”, “on an upper side”, “under”, “next to”, one or more other components can be placed between two parts unless “right” or “directly” is used.

Reference to a device or layer located or disposed “on” another device or layer includes any intervening layer or other devices directly on or between the device and another device.

Although first, second, etc. are used to describe various elements, these elements are not limited by these terms and may not define order. These terms are only used to distinguish one component from another. Accordingly, a first component mentioned below can be a second component within the technical spirit of the present specification.

The size and thickness of each component shown in the drawings are illustrated for convenience of description, and the present disclosure is not necessarily limited to the size and thickness of the illustrated component.

Each feature of various embodiments of the present specification can be partially or wholly combined with each other, and as those skilled in the art will fully understand, technically various interlocking and driving are possible, and each embodiment can be independently implemented with respect to each other and in a related relationship to each other.

The display device of the present disclosure can be applied to an organic light emitting display device, but is not limited thereto, and can be applied to various display devices such as an LED display device or a liquid crystal display device.

Hereinafter, the display device according to various embodiments of the present disclosure will be described with reference to the accompanying drawings. All the components of each display device according to all embodiments of the present disclosure are operatively coupled and configured.

FIG. 1 is a system configuration diagram of a display device according to an embodiment of the present disclosure.

Referring to FIG. 1, a display device 100 can include a display panel 110, a data driving circuit 120, a gate driving circuit 130, and a timing controller 140.

The display panel 110 can include a display area AA in which an image is displayed and a non-display area NA in which an image is not displayed. The non-display area NA can be an area outside of the display area AA or can be a bezel area.

The display panel 110 can include a plurality of pixels and a plurality of sub-pixels constitute each of the plurality of pixels. Each of the sub-pixels can include a sub-pixel electrode SPE and a drive transistor DRT configured to drive the sub-pixel electrode SPE, and can further include a common electrode CE and a light emitting layer EL. A part of the sub-pixel in which light is emitted is a sub-light emitting part and has a size larger than the size of the sub-pixel electrode. Light of a desired color can be embodied by mixing light emitted from at least three sub-pixels, and a light emitting part including at least three sub-light emitting parts can be configured. The light emitting part can be disposed by corresponding to the pixel electrode. For example, the light emitting part can be disposed to correspond to the pixel electrode.

The display panel 110 can further include various types of signal wires for driving the plurality of sub-pixels. Each of the plurality of sub-pixels can include at least one or more of transistor and at least one or more of capacitor. Each of the plurality of sub-pixels can further include a light emitting diode that emits its own light. For example, the light emitting diode can be configured as an organic light emitting diode OLED, micro LED or quantum dot.

In addition, signal wires having various types can include a plurality of data lines which transmits data signals (a data voltage or an image signal) and a plurality of gate lines which transmits gate signals (scan signals). The plurality of data lines extends in a first direction and the plurality of gate lines extends in a second direction to intersect with each other. Here, the first direction can be a vertical direction, and the second direction can be a horizontal direction. In this specification, the vertical and horizontal directions are relative to each other. For example, if the first direction is a horizontal direction, the second direction can be a vertical direction. For instance, the first and second directions can be perpendicular or substantially perpendicular to each other.

The data driving circuit 120 is a circuit configured to drive the plurality of data lines and can output data signals to the plurality of data lines. The gate driving circuit 130 is a circuit for driving the plurality of gate lines and can output gate signals to the plurality of gate lines. The timing controller 140 is a device configured to control the data driving circuit 120 and the gate driving circuit 130 and can control driving timings for the plurality of data lines and driving timings for the plurality of gate lines.

The timing controller 140 can supply a data drive control signal to the data driving circuit 120 configured to control the data driving circuit 120 and can supply a gate drive control signal to the gate driving circuit 130 configured to control the gate driving circuit 130.

The data driving circuit 120 can supply the data signals to the plurality of data lines according to the driving timing control of the timing controller 140. The gate driving circuit 130 can supply the gate signals to the plurality of gate lines according to the timing control of the timing controller 140. The data driving circuit 120 can be a data driving circuit of a chip on film (COF) type, a chip on glass (COG) type, or a chip on panel (COP) type. The gate driving circuit 130 can be a gate driving circuit of a gate in panel (GIP) type, a COF type, a COG type, or a chip on panel (COP) type. When the gate driving circuit 130 is a gate driving circuit of the GIP type, the gate driving circuit 130 can be formed directly in the non-display area NA of the display panel 100.

Referring to FIG. 1, in the display device 100 according to an embodiment of the present disclosure, the display device can have a touch sensing function in addition to an image display function. The display device 100 includes a touch electrode and a touch sensing circuit 150 to sense a touch, and whether a touch has occurred and a touch position can be detected through the touch electrode and the touch sensing circuit 150. The touch is generated by an object such as a finger or a pen.

The touch electrode can be configured in several manners. For example, the touch electrode can be configured directly on the display panel 110, directly inside the display panel 110, or by attaching a touch panel to the display panel 110 after forming the touch panel. The touch panel according to the touch panel attachment method can be configured by disposing the touch electrode between a plurality of transparent substrates formed of glass or plastic, or by disposing the touch electrode on the upper or lower part of a transparent substrate formed of glass or plastic or on both the upper and lower parts thereof.

When the touch electrode is directly formed inside the display panel 110, a common electrode formed during the manufacturing process of the display panel 110 is used as the touch electrode and can have a touch routing wire connected to the common electrode.

In the case in which the touch electrode is disposed directly on the display panel 110, the touch electrode can be formed directly on a surface of an encapsulation layer or the planarization layer of a self-luminous display device such as an organic light emitting display device or a micro LED.

The touch sensing circuit 150 can perform touch sensing by a self-capacitance sensing method or a mutual-capacitance sensing method.

When the touch sensing circuit 150 performs the touch sensing by the self-capacitance sensing method, the touch sensing circuit 150 can perform the touch sensing by detecting change in capacitance formed between the touch electrode and a touch object (e.g. a finger, pen, etc.).

When the touch sensing circuit 150 performs the touch sensing by the mutual-capacitance sensing method, the touch sensing circuit 150 can perform the touch sensing by detecting change in capacitance formed between touch electrodes.

The structure of a touch electrode (a touch routing wire included) for the self-capacitance sensing method and the structure of a touch electrode (a touch routing wire included) for a mutual-capacitance sensing method are configured to be different from each other, and the driving and sensing operations of a touch panel for the self-capacitance sensing method and the driving and sensing operations of a touch panel for the mutual-capacitance sensing method can be performed differently.

In the mutual-capacitance sensing method, the plurality of touch electrodes are disposed by being divided into driving touch electrodes and sensing touch electrodes and perform driving and sensing operations by the driving touch electrodes and sensing touch electrodes different from each other.

In the self-capacitance sensing method, the plurality of touch electrodes are not divided into driving touch electrodes and sensing touch electrodes, and each of the touch electrodes performs the functions of a driving touch electrode and a sensing touch electrode at the same time.

The touch sensing circuit 150 can be configured integrally with the data driving circuit 120, or can be configured separately therefrom so as to be connected to the display panel.

Figure 2:
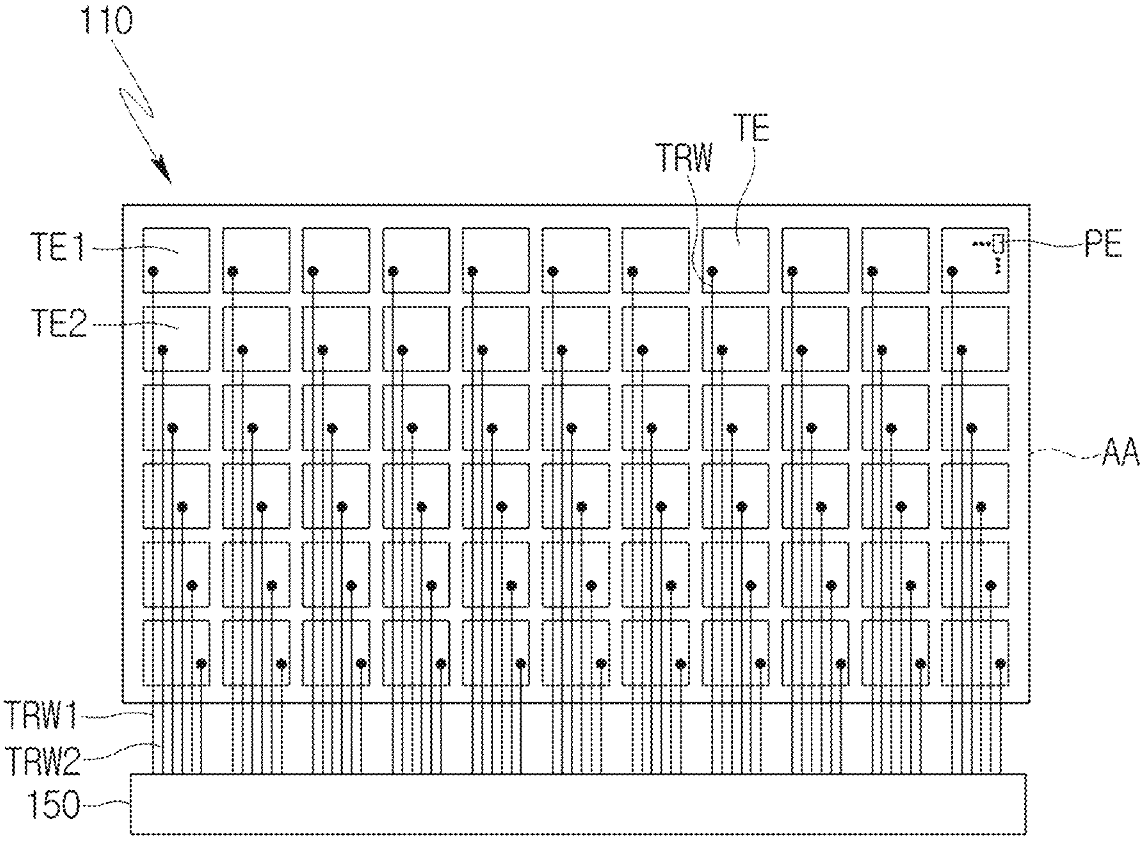
FIG. 2 illustrates structures of a touch electrode and a touch routing wire in a display panel of the display device according to a first embodiment of the present disclosure.

FIG. 2 illustrates the structures of the touch electrode and the touch routing wire in the display panel of the display device according to an embodiment of the present disclosure. The structure of touch sensors illustrated in FIG. 2 is configured in the self-capacitance sensing method, but embodiments of the present disclosure are not limited thereto.

Referring to FIG. 2, the display panel 110 of the display device 100 according to an embodiment of the present disclosure can include a plurality of touch electrodes TE as the touch sensors.

The plurality of touch electrodes is disposed in the display area AA of the display panel 110. the touch electrodes can include the plurality of touch metals, which will be described later, extending in the first direction and the second direction on a plurality of pixel electrodes PE.

Herein, the term 'metal' or 'metals' can be interchangeable used with one or more layers/elements, or a portion of one or more layers/elements. The touch electrode formed on the display panel 110 by including the plurality of touch metals extending in the first direction and the second direction can be configured. In addition, the display panel 110 of the display device 100 can further include a plurality of touch routing wires TRW configured to electrically connect the plurality of touch electrodes TE to the touch sensing circuit 150.

The plurality of touch electrodes TE are disposed by being spaced apart from each other. Each of the plurality of touch electrodes TE can be independently configured to be separated from each other from others. The routing wires can electrically connect one of the plurality of touch electrodes separated from each other to the touch sensing circuit.

One touch electrode TE can have various shapes (e.g. square, rhombus, triangle, round, and oval, etc.) and can be a plate-type touch electrode in which an opening part is not formed or a mesh-type touch electrode in which at least two or more opening parts are formed.

The size of one touch electrode TE can be formed to correspond to the size of the plurality of pixels. For example, a minimum area in which a finger touches the display panel is similar to the size of 12 pixel electrodes PE which are arranged horizontally and vertically, respectively, relative to the display panel. Accordingly, one touch electrode TE can have a size similar to the size of 12 pixel electrodes PE which are arranged horizontally and vertically, respectively, relative to the size of a pixel. The size of the touch electrode is not limited thereto, and as the resolution of the display device increases, the number of pixels corresponding to the size of the touch electrode can increase.

The plurality of touch metals constitute the touch electrode TE and extending in the first direction and the second direction is connected with each other to form a shape of a mesh and can be disposed between the sub-pixel electrodes. Accordingly, in a case in which the touch electrode TE has the mesh shape, opening parts formed in the touch electrode TE can overlap the sub-light emitting parts.

A plurality of touch metals extending in the first direction and a plurality of touch metals extending in the second direction can be formed on layers different from each other or on the same layer. When the touch metals extending in the first direction and the touch metals in the second direction are formed on layers different from each other, the touch metals formed on the layers different from each other can be connected to each other by using a hole of the planarization layer for forming the touch electrode TE.

The touch electrode TE and the touch routing wire TRW can be disposed on layers different from each other or can be disposed on the same layer. The touch electrode TE and the touch routing wire TRW can be touch metals different from each other, or can be the same touch metals. The touch routing wire TRW can be configured by using one touch metal or at least two or more of touch metals.

The plurality of touch electrodes TE can include a first touch electrode TE1 and a second touch electrode TE2, and distance between the first touch electrode TE1 and the touch sensing circuit 150 can be longer than distance between the second touch electrode TE2 and the touch sensing circuit 150.

A first touch routing wire TRW1 electrically connected with the first touch electrode TE1 can be configured to be longer than a second touch routing wire TRW2 electrically connected with the second touch electrode TE2, and the first touch routing wire TRW1 can overlap with the first touch electrode TE1 and the second touch electrode TE2.

The first touch routing wire TRW1 can be configured by extending to the touch sensing circuit 150 after selecting a portion of the plurality of touch metals. The second touch electrode TE2 can be electrically disconnected (or isolated) from the first touch routing wire TRW1.

The touch routing wire TRW can be connected with the touch sensing circuit 150 through the touch pad part TP disposed in the non-display area NA which is outside of the display area AA of the display panel 110.

Figure 3:
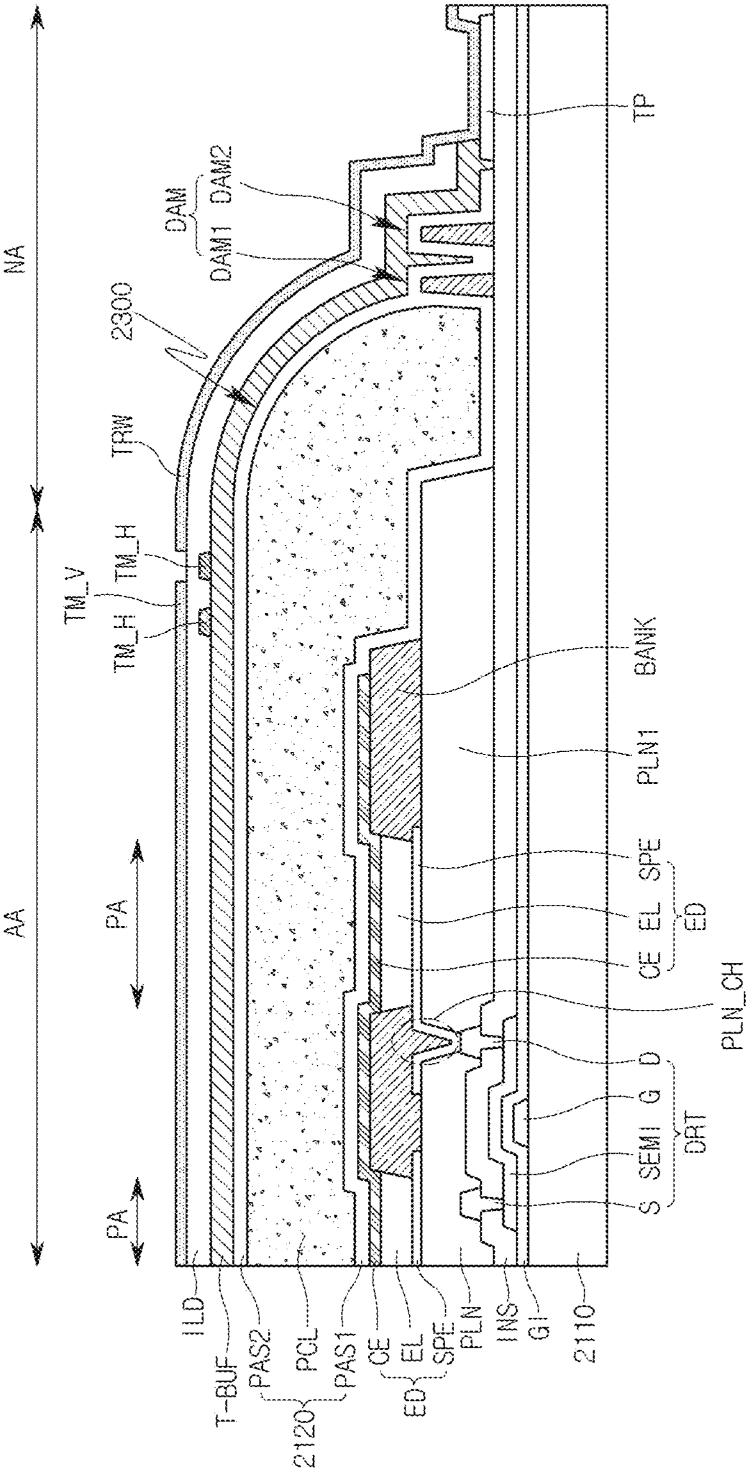
FIG. 3 is a sectional view illustrating a connection structure between the touch routing wire and a touch pad part disposed on the display panel of the display device according to the first embodiment of the present disclosure.

FIG. 3 is a sectional view illustrating a connection structure between the touch routing wire and the touch pad part disposed on the display panel of the display device according to an embodiment of the present disclosure. For example, a structure in which the touch electrode is disposed directly on the display panel is illustrated.

The sectional view illustrated in FIG. 3 is a view illustrating the sectional structure of the outer area of the display panel 110. Referring to FIG. 3, the outer part of the display panel 110 can include a portion of display area AA and the non-display area NA.

Referring to FIG. 3. the drive transistor DRT of each sub-pixel SP located in the display area AA can be disposed on a substrate 2110. Here, the substrate 2110 can be a transparent substrate.

The drive transistor DRT can include a gate electrode G, a source electrode S, and a drain electrode D. The drive transistor DRT can further include a semiconductor layer SEMI.

A gate insulating layer GI is disposed between the gate electrode G and the semiconductor layer SEMI. The source electrode S is formed on an insulating layer INS and can be connected with a first side of the semiconductor layer SEMI through a hole. The drain electrode D is formed on the insulating layer INS and can be connected with a second side of the semiconductor layer SEMI through a hole.

The light emitting diode ED configured as the organic light emitting diode OLED can include the sub-pixel electrode SPE correspond to an anode electrode, a light emitting layer EL formed on the sub-pixel electrode SPE, and a common electrode CE formed on the light emitting layer EL and correspond to a cathode electrode. For another example, the sub-pixel electrode SPE can be a cathode electrode, and the common electrode CE can be an anode electrode.

The sub-pixel electrode SPE can be electrically connected with the drain electrode D of the drive transistor DRT exposed through a planarization layer hole PLN_CH formed in a first planarization layer PLN1.

The light emitting layer EL is formed on the sub-pixel electrode SPE of a light emitting part PA provided (exposed to) by a bank BANK. For example, the light emitting layer EL can include a hole-related layer, a light emitting layer and an electron-related layer to form a stacked structure. The common electrode CE can be configured to opposite to the sub-pixel electrode SPE with the light emitting layer EL disposed between the common electrode CE and the sub-pixel electrode SPE.

The light emitting diode ED can be vulnerable to moisture or oxygen and thus can have an encapsulation layer 2120 formed thereon that prevents the exposure of the light emitting diode to the moisture or oxygen. The encapsulation layer 2120 can be configured as a single layer. But as illustrated in FIG. 3, the encapsulation layer 2120 can be configured as a plurality of layers PAS1, PCL, and PAS2, but is not limited thereto.

For example, when the encapsulation layer 2120 is configured as the plurality of layers PAS1, PCL, and PAS2, the encapsulation layer 2120 can include at least one inorganic encapsulation layer PAS1 or PAS2 and at least one organic encapsulation layer PCL. The encapsulation layer 2120 can have a structure in which a first inorganic encapsulation layer PAS1, an organic encapsulation layer PCL, and a second inorganic encapsulation layer PAS2 are sequentially stacked.

The first inorganic encapsulation layer PAS1 is disposed on the common electrode CE and is disposed closest to the light emitting diode ED. The first inorganic encapsulation layer PAS1 can be formed of an inorganic insulating material which can be deposited at a low temperature. For example, the first inorganic encapsulation layer PAS1 can be formed of silicon nitride (SiNx), silicon oxide (SiOx), silicon oxynitride (SiON), or aluminum oxide ($Al_2O_3$). Since the first inorganic encapsulation layer PAS1 is deposited in a low-temperature atmosphere, during the deposition process, the first inorganic encapsulation layer PAS1 can prevent damage to the light emitting layer EL, which includes organic materials that are vulnerable to high-temperature atmosphere.

The organic encapsulation layer PCL can be formed to have an area smaller than the area of the first inorganic encapsulation layer PAS1. In this case, the organic encapsulation layer PCL can be formed such that both ends or both sides of the first inorganic encapsulation layer PAS1 are exposed. The organic encapsulation layer PCL can act as a buffer configured to relieve stress between each layer due to bending of the display device 100 which is an organic light emitting display device. For example, the organic encapsulation layer PCL can be formed of acrylic resin, epoxy resin, polyimide, polyethylene, or silicon oxycarbon (SiOC), and can be formed of an organic insulating material, but the material of the organic encapsulation layer PLC is not limited thereto.

In order to prevent the liquid encapsulation layer 2120 from collapsing during the manufacturing process of the display panel 100, one or more dams DAM1 and DAM2 can be disposed in the outer area of the encapsulation layer 2120.

A touch buffer film T-BUF can be disposed on the encapsulation layer 2120. The touch buffer film T-BUF improves adhesion between the encapsulation layer and the touch metal, thereby preventing the separation of the touch metal from the encapsulation layer and preventing the encapsulation layer 2120 or the light emitting diode ED from being damaged in the process of forming the touch metal.

The touch metal can be formed on the touch buffer film T-BUF. The touch metal can include the plurality of touch metals extending in the first direction and the second direction on the plurality of pixel electrodes. Each of the plurality of first touch metals TM_V extending in the first direction can include a first touch metal group TMG_1, a second touch metal group TMG_2, and a third touch metal group TMG_3. Each of a plurality of second touch metals TM_H extending in the second direction can include a fourth touch metal group TMG_4. Each touch metal group can include a plurality of touch wires. The structure of the touch metal group will be described in detail in the embodiment to be described later.

The plurality of touch metals TM_V extending in the first direction and the plurality of touch metals TM_H extending in the second direction can be disposed at layers different from each other or at the same layer. An interlayer insulation film ILD can be disposed between the plurality of touch metals TM_V extending in the first direction and the plurality of touch metals TM_H extending in the second direction.

The display panel 110 can include the encapsulation layer 2120 disposed in the plurality of light emitting parts PA and the transmission part and disposed on the common electrode CE; the dam DAM disposed at the periphery of the encapsulation layer 2120; the touch pad part TP disposed on the substrate 2110 in the non-display area NA. In addition, the touch sensing circuit 150 can be electrically connected to the touch pad part TP.

The encapsulation layer 2120 includes an inclining surface 2300 on an outside thereof. In the plurality of first touch metals TM_V extending in the first direction, each of the touch wires performing the function of the touch routing wire TRW extends along the inclining surface 2300 of the encapsulation layer 2120, and passes over the dam DAM1 and DAM2 and can be electrically connected to the touch pad part TP disposed in the non-display area NA.

The sectional view of FIG. 3 illustrates a conceptual structure, and the position, thickness, or width of each pattern (various layers or various electrodes) can be changed depending on the viewing direction or position, and the connection structure of each of various patterns can also be changed. In addition to several illustrated layers, additional layers can be present, and some of the illustrated various layers can be omitted or integrated with each other.

Figure 4A:
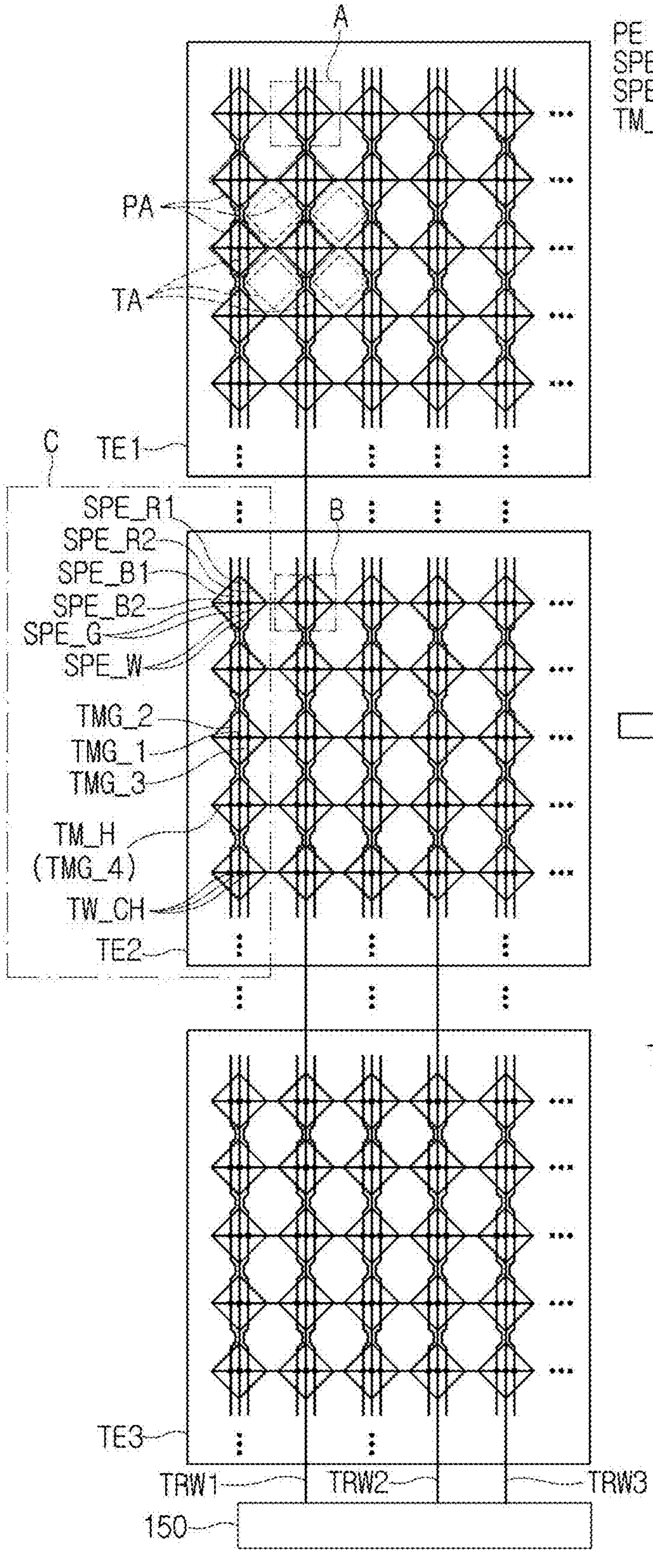
FIGS. 4A, 4B and 4C illustrate a plurality of first touch metals extending in a first direction and a plurality of second touch metals extending in a second direction on a plurality of pixel electrodes according to a first embodiment of the present disclosure.
Figure 4B:
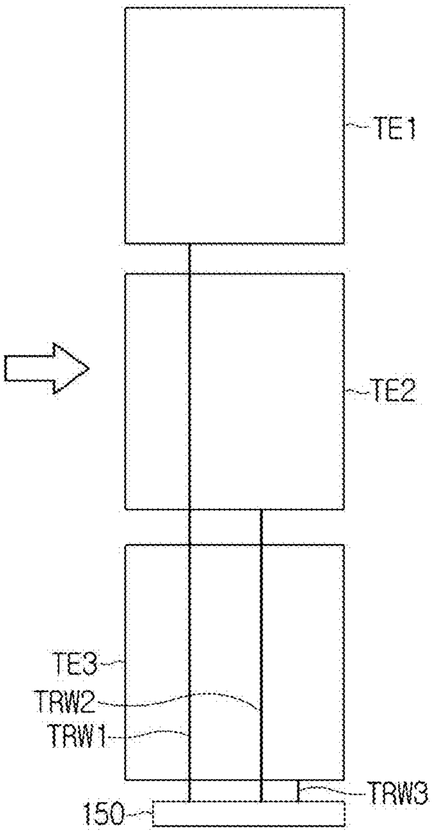
Figure 4C:
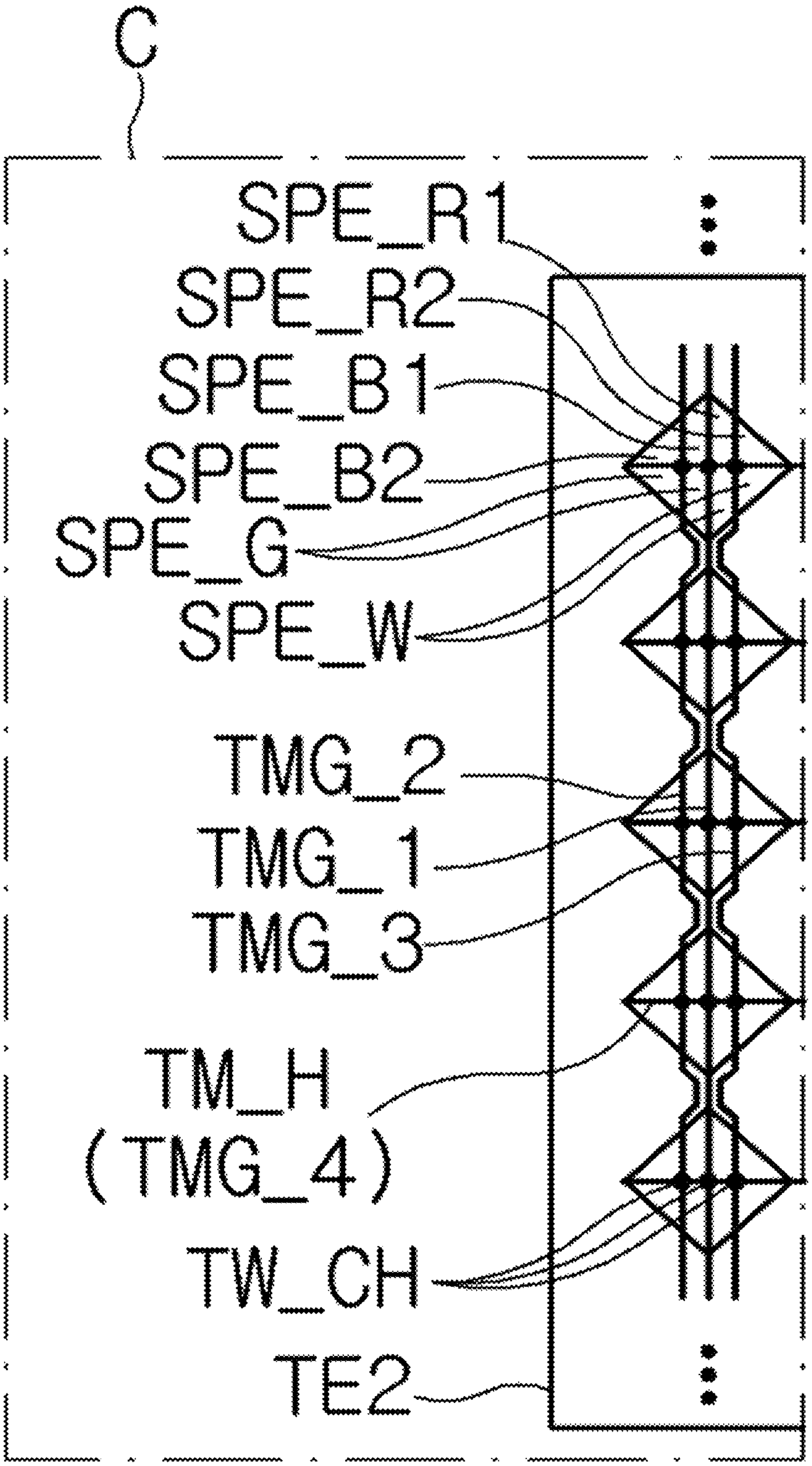

FIGS. 4A, 4B and 4C are views illustrating the plurality of first touch metals extending in the first direction and the plurality of second touch metals extending in the second direction on the plurality of pixel electrodes according to an embodiment of the present disclosure.

Referring to FIG. 4A, the plurality of pixel electrodes PE is disposed inside the display area AA. In FIG. 4A, each of the plurality of pixel electrodes PE is illustrated to have a shape of rhombus, but can be configured to have a shape of diamond, cross, or square. Each of the plurality of pixel electrodes PE can include the plurality of sub-pixel electrodes SPE and can include a red sub-pixel electrode SPE_R, a blue sub-pixel electrode SPE_B, a green sub-pixel electrode SPE_G, and a white sub-pixel electrode SPE_W.

The sub-pixel can include the sub-pixel electrode SPE, the drive transistor DRT configured to drive the sub-pixel electrode SPE, the common electrode CE, and the light emitting layer EL. The plurality of sub-pixels can emit light of different colors by using the light emitting layer EL formed of different materials, or can emit light of the same color by using the light emitting layer EL formed of the same material. When the light of the same color is emitted, color filters having different colors are disposed on the plurality of pixels such that each of the sub-pixels can realize light of a different color.

In consideration of the characteristic of light emission, the sub-light emitting part emitting light by corresponding to each of the sub-pixel electrodes SPE can have an area larger than the area of each of the sub-pixel electrodes SPE. Accordingly, even when one sub-pixel electrode SPE is divided into a plurality of parts, the light emitting part can have an integrated shape without being divided.

Each of the pixel electrodes PE is composed of the plurality of sub-pixel electrodes SPE and can embody the light of a color desired by a user by mixing colors embodied in the plurality of sub-pixel electrodes. The light emitting part PA can be configured as a part including a plurality of sub-light emitting parts. The plurality of light emitting parts PA is disposed in the display area AA of the display panel 110 and embodies a desired image. In the display area AA of the display panel 110, an area in which the plurality of light emitting parts PA is not disposed can be the transmission parts TA. The plurality of transmission parts TA is disposed at a side of the plurality of light emitting parts PA and can be disposed between each of the plurality of light emitting parts PA. The plurality of transmission parts TA surrounded by the plurality of light emitting parts PA can be formed in a shape of rhombus, diamond, square, octagon, or circle.

Here, the plurality of transmission parts TA can be a transparent part in which a background behind the display panel 110 can be seen. A transparent display device can be embodied by including the plurality of light emitting parts PA and the plurality of transmission parts TA.

When the transmission part TA is disposed in a pattern such as a rhombus, diamond, square, octagon, or circle in which horizontal and vertical lengths are symmetrical to each other, the haze of the transparent display device can be prevented to improve display quality thereof.

Referring to FIGS. 3, 4A, 4B and 4C, the touch metal is formed on the plurality of pixel electrodes PE, and the touch metal on the plurality of pixel electrodes can include the plurality of first touch metals TM_V extending in the first direction and the plurality of second touch metals TM_H extending in the second direction. Here, the first direction can be a vertical direction, and the second direction can be a horizontal direction. In this specification, the vertical and horizontal directions are relative to each other. For example, the first direction can be a horizontal direction, and the second direction can be a vertical direction.

The bank BANK disposed between the plurality of first touch metals TM_V and the plurality of second touch metals TM_H, and the light emitting layer EL can overlap and be disposed on the light emitting layer EL, the bank partitioning the plurality of sub-light emitting parts. The bank has a shape of a mesh but can be formed in a shape of a stripe, but is not limited thereto.

Each of the plurality of first touch metals TM_V can include the first touch metal group TMG_1, the second touch metal group TMG_2, and the third touch metal group TMG_3. The first touch metal group TMG_1 can be disposed between the plurality of sub-pixel electrodes SPE adjacent to each other in the second direction. For example, the first touch metal group TMG_1 can be disposed between the blue sub-pixel electrode SPE_B or the green sub-pixel electrode SPE_G and the red sub-pixel electrode SPE_R or the white sub-pixel electrode SPE_W. The first touch metal group TMG_1 can be disposed rectilinearly along the first direction in the display area AA.

The second touch metal group TMG_2 is disposed at the left of the first touch metal group TMG_1 and can be disposed between a plurality of parts into which the sub-pixel electrode to be described later is divided. For example, the second touch metal group TMG_2 can be disposed between a first electrode part SPE_B1 disposed at the left side of the blue sub-pixel electrode SPE_B and a second electrode part SPE_B2 disposed at the right side of the blue sub-pixel electrode SPE_B. The second touch metal group TMG_2 can be disposed rectilinearly along the first direction in the display area AA; can be disposed rectilinearly along the first direction between the first electrode part SPE_B1 and the second electrode part SPE_B2 of the blue sub-pixel electrode; and can be disposed along the periphery of the sub-pixel electrode SPE in other parts.

The third touch metal group TMG_3 is disposed at the right side of the first touch metal group TMG_1, and can be disposed between the first electrode part and the second electrode part of the sub-pixel electrode to be described later. For example, the third touch metal group TMG_3 can be disposed between the first electrode part SPE_R1 disposed at the right side of the red sub-pixel electrode SPE_R and the second electrode part SPE_R2 disposed at the left side of the red sub-pixel electrode SPE_R. The third touch metal group can be disposed rectilinearly along the first direction in the display area AA, can be disposed rectilinearly along the first direction between the first electrode part SPE_R1 and the second electrode part SPE_R2 of the red sub-pixel electrode, and can be disposed along the periphery of the sub-pixel electrode SPE in other parts.

Each of the plurality of second touch metals TM_H can include the fourth touch metal group TMG_4, and the fourth touch metal group TMG_4 can be disposed between the plurality of sub-pixel electrodes SPE adjacent thereto in the first direction. For example, each of the plurality of second touch metals TM_H can be disposed between the red sub-pixel electrode SPE_R or the blue sub-pixel electrode SPE_B, and the green sub-pixel electrode SPE_G or the white sub-pixel electrode SPE_W.

Most of the first touch metal group TMG_1, the second touch metal group TMG_2, the third touch metal group TMG_3, and the fourth touch metal group TMG_4 can be disposed between the sub-pixel electrodes or can be disposed between the first electrode part and the second electrode part of the sub-pixel electrode, and only a portion thereof can be disposed at the periphery of the sub-pixel electrode.

Accordingly, in order to increase the transmittance, the touch metal is not required to be removed, so the display device of the present disclosure can have more improved touch sensitivity compared to a conventional display device having the same transmittance.

The first touch metal group TMG_1, the second touch metal group TMG_2, the third touch metal group TMG_3, and the fourth touch metal group TMG_4 can include at least one or more of touch wire TW. For example, the first touch metal group TMG_1, the second touch metal group TMG_2, and the third touch metal group TMG_3 can include at least three touch wires TW, and the fourth touch metal group TMG_4 can include one touch wire TW.

The three or more of touch wires have the more decreased charging time of the touch electrode taken to sense a touch than one touch wire having one thick width, thereby improving touch sensitivity.

The touch wires TW included in the first touch metal group TMG_1, the second touch metal group TMG_2, the third touch metal group TMG_3, and the fourth touch metal group TMG_4 are connected to each other, so performance of the touch electrode TE can be improved.

When the touch wire TW is disposed only in each part of the touch electrodes TE, the touch wire TW can be the touch electrode TE, and when the touch wire TW extends to the outside of the touch electrode TE, the touch wire TW can be the touch electrode TE and the touch routing wire TRW and can perform the functions of the touch electrode TE and the touch routing wire TRW at the same time.

For example, at least one of the touch wires TW constituting the first touch metal group TMG_1, the second touch metal group TMG_2, or the third touch metal group TMG_3 can be used as the touch routing wire for electrically connecting the touch electrode TE to the touch sensing circuit 150.

FIG. 4A illustrates the embodiment of the touch electrode TE using the self-capacitance sensing method. The display device of the present disclosure is not limited thereto but can be applied even to the mutual-capacitance sensing method.

Referring to FIG. 4A, the plurality of touch electrodes TE can be configured by connecting the plurality of first touch metals TM_V with the plurality of second touch metals TM_H.

As for the first touch electrode TE1 disposed at the uppermost of the plurality of touch electrodes TE, other touch routing wires TRW except for the first touch routing wire TRW1 are not disposed in the first touch electrode TE1. Accordingly, in a part in which the first touch electrode TE1 is disposed, the plurality of first touch metals TM_V and the plurality of second touch metals TM_H can be connected to each other to be used as the first touch electrode TE1 having the shape of a mesh. The plurality of first touch metals TM_V and the plurality of second touch metals TM_H which are used as the first touch electrode TE1 do not extend to the entire surface of the display panel 110, but are separated from other touch electrodes, so the first touch electrode can be used as an individual touch electrode.

The second touch electrode TE2 is disposed under the first touch electrode TE1. In a part in which the second touch electrode TE2 is disposed, the remaining plurality of first touch metals TM_V and the remaining plurality of second touch metals TM_H except for the first touch routing wire TRW1 are connected to each other and can be used as the second touch electrode TE2 having the shape of a mesh.

The plurality of first touch metals TM_V and the plurality of second touch metals TM_H which are used as the second touch electrode TE2 do not extend to the entire surface of the display panel 110, but are separated from other touch electrodes, so the second touch electrode can be used as an individual touch electrode.

In addition, the third touch electrode TE3 is disposed under the second touch electrode TE2. In a part in which the third touch electrode TE3 is disposed, the remaining plurality of first touch metals TM_V and the remaining plurality of second touch metals TM_H except for the first touch routing wire TRW1 and the second touch routing wire TRW2 are connected to each other and can be used as the third touch electrode TE3 having the shape of a mesh. The plurality of first touch metals TM_V and the plurality of second touch metals TM_H which are used as the third touch electrode TE3 do not extend to the entire surface of the display panel 110, but are separated from other touch electrodes, so the third touch electrode can be used as an individual touch electrode.

As the touch electrode TE is disposed at a lower side, the number of the first touch metals TM_V used by the touch electrode TE decreases due to the touch routing wire TRW used by the touch electrode TE disposed at an upper side. Accordingly, in order to have the same level of the touch sensitivity in the entire part of the display panel 110, the number of the first touch metals TM_V or the second touch metals TM_H used by each touch electrode TE is adjusted such that the touch sensitivity can be entirely adjusted.

The second touch metal TM_H used as the touch electrode TE is not used as the touch routing wire TRW, and is used only as a touch electrode TE for the touch sensing, so the plurality of touch electrodes TE can use the second touch metals TM_H having the same number as the number of the plurality of touch electrodes TE.

The first touch metal TM_V and the second touch metal TM_H constituting the touch electrode TE can be connected to each other. The connection of the first touch metal TM_V with the second touch metal TM_H can be performed in various methods. In FIG. 4C, the connection of the first touch metal TM_V with the second touch metal TM_H is illustrated to be performed through a touch wire hole TW_CH marked with a dot at a position at which the first touch metal TM_V and the second touch metal TM_H intersect with each other, but is not limited thereto.

The touch wire hole TW_CH can be used even when connecting the touch electrode TE with the touch routing wire TRW. For example, the first touch routing wire TRW1 connected with the first touch electrode TE1 is connected to the second touch metal TM_H included in the first touch electrode TE1 through the touch wire hole TW_CH but may not be connected to other touch electrodes TE1 and TE2 etc.

Figure 5A:
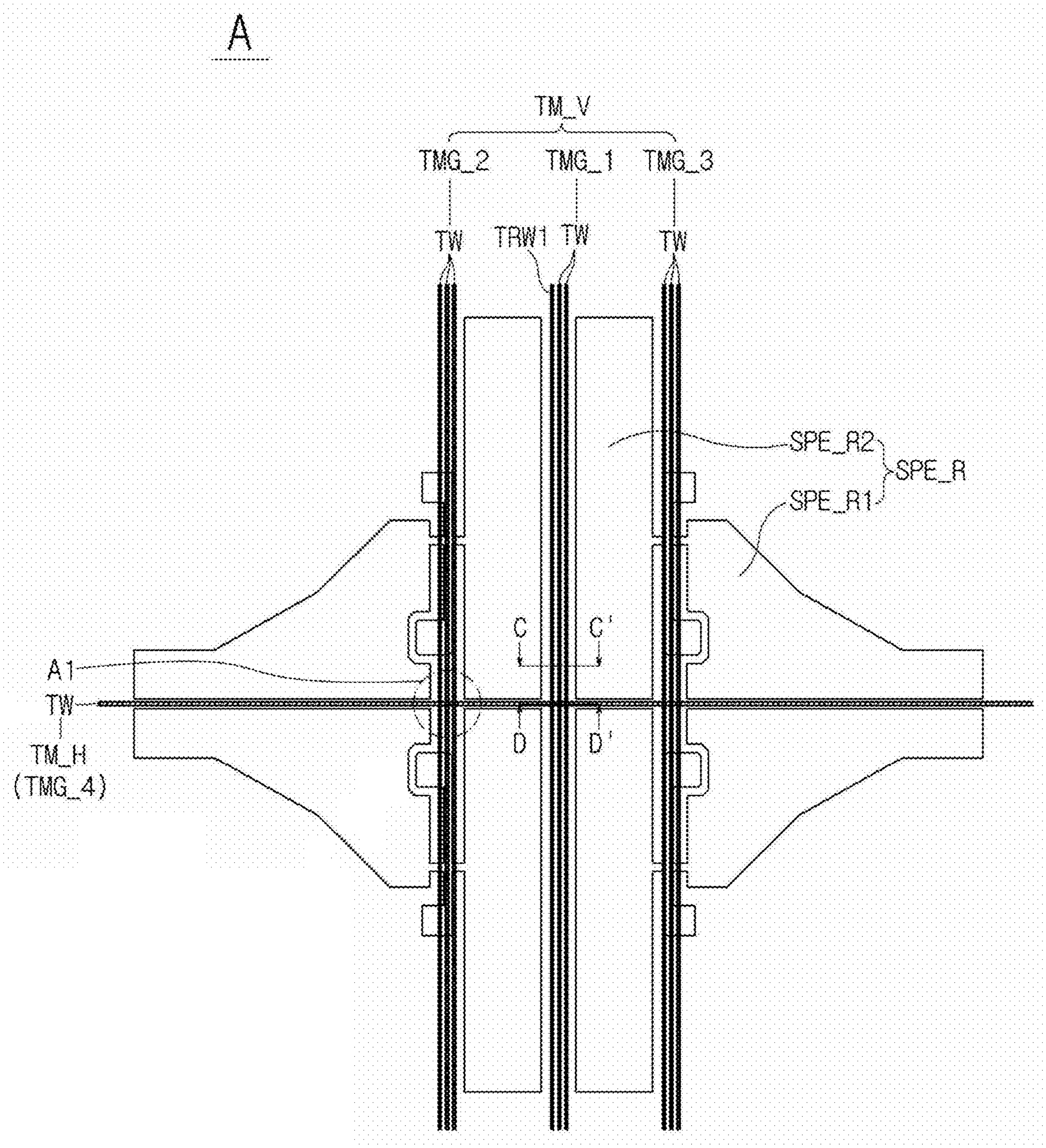
FIG. 5A and FIG. 5B illustrate an A part of a first touch electrode TE1 of FIG. 4A.
Figure 5B:
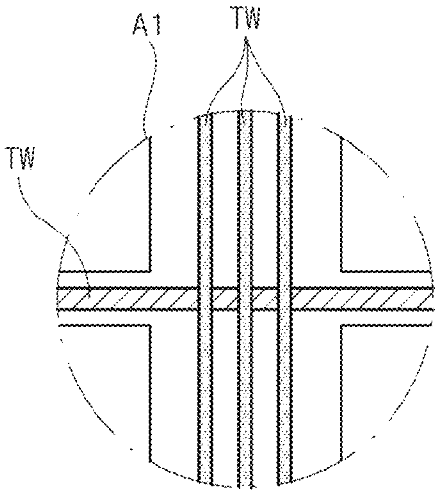

FIG. 5A illustrates an A part of the first touch electrode TE1 of FIG. 4A. FIG. 5B illustrates an enlarged part of FIG. 5A. FIG. 5A illustrates an arrangement structure of the touch wire TW and the touch routing wire TRW disposed on one pixel electrode according to the present disclosure.

Referring to FIG. 5 each of the first touch metal group TMG_1, the second touch metal group TMG_2, and the third touch metal group TMG_3 included in the first touch metal TM_V can include at least three or more of touch wires TW. In FIG. 5, the touch wire is illustrated to have three touch wires TW but is not limited thereto. In addition, the fourth touch metal group TMG_4 included in the second touch metal TM_H can include at least one or more of touch wire TW. In the drawing, the touch wire TW is illustrated as one touch wire but is not limited thereto.

A portion of the touch wires TW included in the first touch metal group TMG_1 can be used as the first touch routing wire TRW1. In the drawing, one of the touch wires TW included in the first touch metal group TMG_1 is illustrated to be selected as the first touch routing wire TRW1, but the number of the touch wires selected as the first touch routing wire is not limited thereto. A touch wire TW included in the second touch metal group TMG_2 or the third touch metal group TMG_3 can be used as the touch routing wire TRW, and instead of one touch wire TW, at least two or more of touch wires TW can be used as the touch routing wire TRW. The touch routing wire TRW is configured to be included in a portion of the touch electrode TE and can simultaneously perform the function of the touch routing wire TRW and the function of the touch electrode TE which generates capacitance for the touch sensing.

The first touch metal TM_V and the second touch metal TM_H included in the touch electrode TE can be connected to each other and can be selectively connected to each other at the intersection of the first touch metal TM_V and the second touch metal TM_H.

Figure 6A:
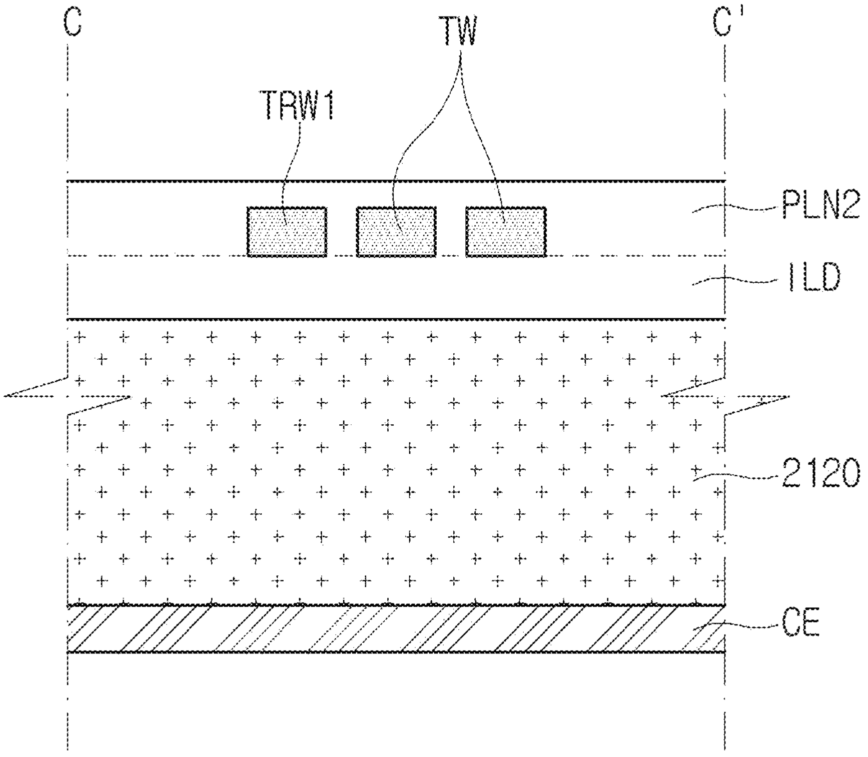
FIG. 6A is a sectional view taken along line C-C' of FIG. 5.

FIG. 6A is a sectional view taken along line C-C' of FIG. 5. FIG. 6A is the sectional view of a part in which the touch wire TW and the touch routing wire TRW included in the first touch metal TM_V are disposed and the second touch metal TM_H is not disposed.

Figure 6B:
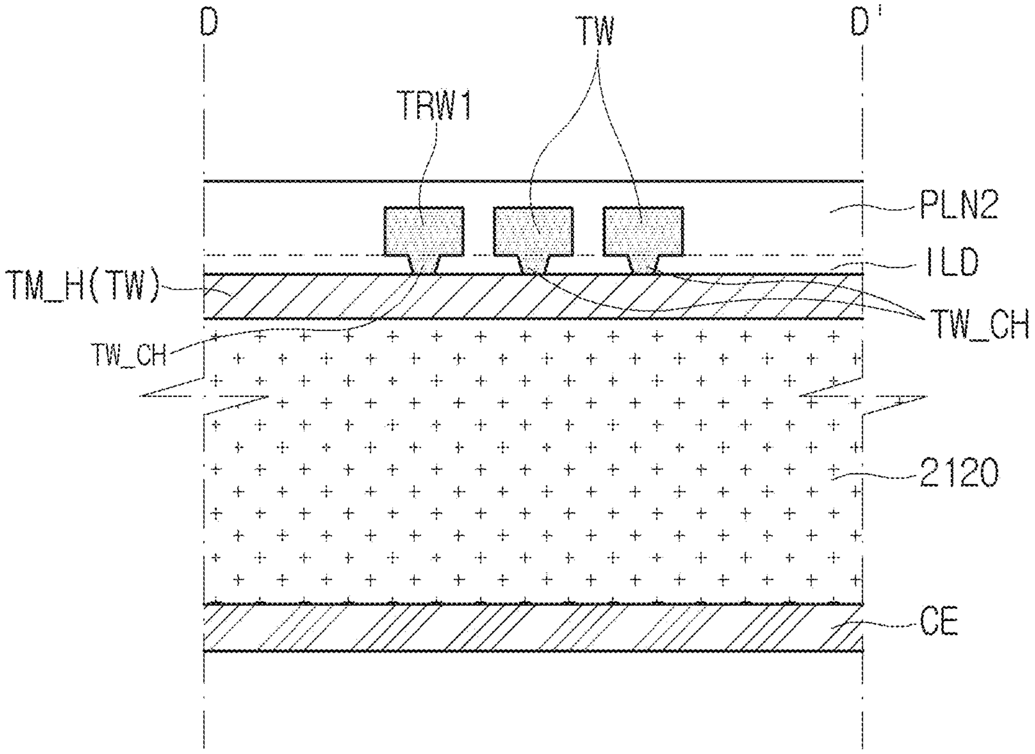
FIG. 6B is a sectional view taken along line D-D' of FIG. 5 according to a first embodiment of the present disclosure.
Figure 6C:
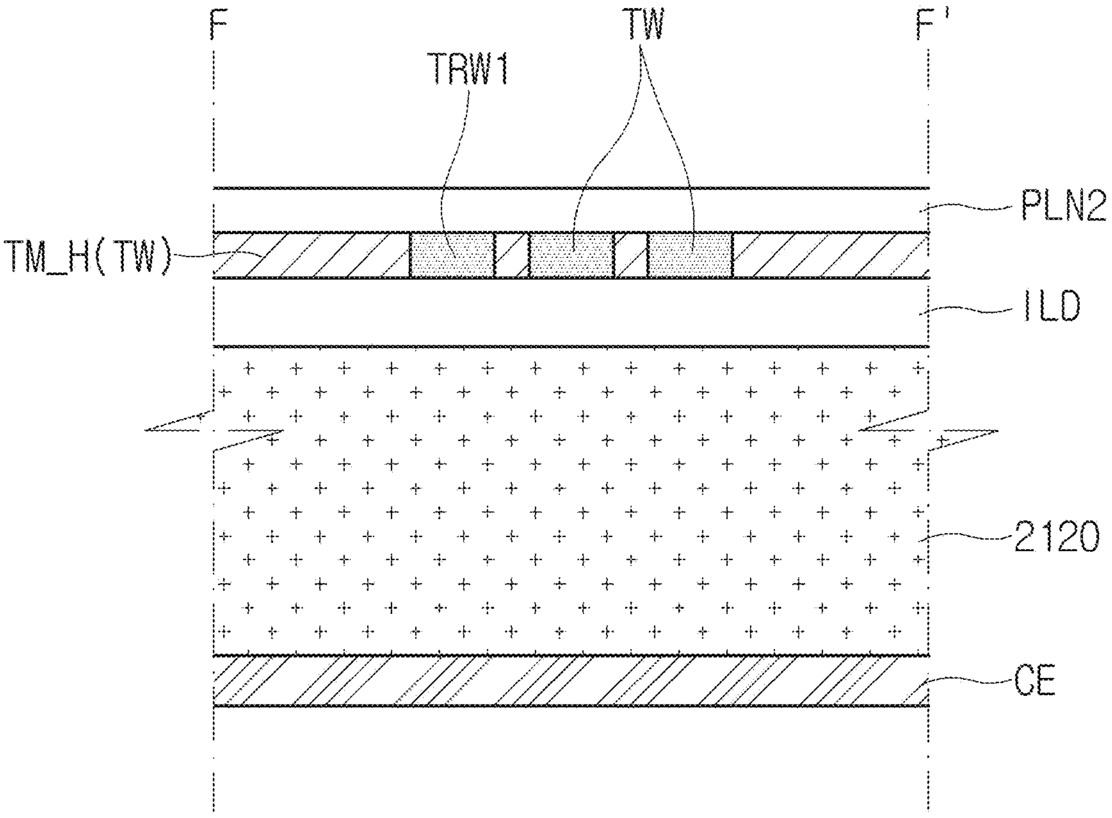
FIG. 6C is a sectional view taken along line D-D' of FIG. 5 according to a second embodiment of the present disclosure.

For example, FIG. 6A to FIG. 6C are views illustrating the connection structure of the first touch metal or the touch routing wire and the second touch metal constituting the touch electrode of FIG. 5 according to an embodiment of the present disclosure.

Referring to FIG. 6A, the touch wire TW and the first touch routing wire TRW1 included in the first touch metal TM_V are disposed on the encapsulation layer 2120, and the touch buffer film can be disposed between the touch wire TW and the encapsulation layer 2120. The interlayer insulation film ILD can be disposed between the touch wire TW or the first touch routing wire TRW1 and the touch buffer film.

In FIG. 6A, the touch wire TW and the first touch routing wire TRW1 included in the first touch metal TM_V are illustrated to be disposed on the interlayer insulation film ILD, but is not limited thereto. The touch wire TW and the first touch routing wire TRW1 can be disposed under the interlayer insulation film ILD, or can be disposed both on and under the interlayer insulation film ILD.

A second planarization layer PLN2 can be disposed on the touch wire TW and the first touch routing wire TRW1 included in the first touch metal TM_V. In addition, a polarizing plate or a cover glass can be disposed on the second planarization layer PLN2.

FIGS. 6B and 6C are sectional views taken along line D-D' of FIG. 5 according to embodiments of the present disclosure, respectively.

The touch wire TW and the first touch routing wire TRW1 included in the first touch metal TM_V and the touch wire TM_H(TW) included in the second touch metal TM_H intersect with each other. In this specification, the sectional view of the connection structure of the intersecting part of the touch wires TW is illustrated in each of FIG. 6B and FIG. 6C according to the first and second embodiment, respectively, but is not limited thereto.

FIG. 6B is a sectional view illustrating the connection structure of the first touch metal TM_V and the second touch metal TM_H constituting the first touch electrode TE1 according to an embodiment of the present disclosure. Referring to FIG. 6B, the touch wire TW and the first touch routing wire TRW1 included in the first touch metal TM_V can be disposed on the interlayer insulation film ILD as in FIG. 6A. In addition, the touch wire TM_H(TW) included in the second touch metal TM_H can be disposed between the encapsulation layer 2120 and the interlayer insulation film ILD.

In order to form the first touch electrode TE1, the touch wire TW and the touch routing wire TRW included in the first touch metal TM_V can be connected with the touch wire TM_H(TW) included in the second touch metal TM_H through the touch wire hole TW_CH.

The touch wire hole TW_CH can be formed in such a manner that after the second touch metal TM_H and the interlayer insulation film ILD are formed sequentially, a hole is formed in the interlayer insulation film ILD at each of positions at which the touch wire TW and the first touch routing wire TRW1 included in the first touch metal TM_V intersect with the second touch metal TM_H. The touch wire hole TW_CH can be formed by a photolithography process or a lift-off process, but is not limited thereto. When the touch wire TW is formed after forming the touch wire hole TW-CH, a metallic material of which the touch wire TW is formed is filled in the touch wire hole TW-CH such that the lower touch wire TM_H(TW) and the upper touch wire TW can be connected with each other.

FIG. 6C is a sectional view illustrating the connection structure of the first touch metal TM_V and the second touch metal TM_H constituting the first touch electrode TE1 according another embodiment of the present disclosure.

Referring to FIG. 6C, the arrangement of the touch wire TW and the first touch routing wire TRW1 included in the first touch metal TM_V can be disposed on the interlayer insulation film ILD as in FIG. 6A. In addition, the touch wire TM_H(TW) included in the second touch metal TM_H can be disposed on the same layer as the layer on which the first touch metal TM_V is disposed.

The first touch metal TM_V and the second touch metal TM_H are formed on the same layer. Accordingly, the first touch metal TM_V and the second touch metal TM_H can be connected to each other even without forming a separate touch wire hole TW_CH.

The first touch metal TM_V and the second touch metal TM_H can be formed at the same time by using the same metal material, or can be formed separately by using different materials.

A metallic material of which the first touch metal TM_V and the second touch metal TM_H are made can be a single material such as titanium (Ti), aluminum (Al), molybdenum (Mo), or copper (Cu), or can be a combination thereof. For example, the layers on which the first touch metal TM_V and the second touch metal TM_H are disposed can be configured by a titanium layer (Ti)-aluminum layer (Al)-titanium layer (Ti) stacked on each other, or a molybdenum layer (Mo)-aluminum layer (Al)-molybdenum layer (Mo) stacked on each other.

The first touch electrode TE1 described above is disposed at the uppermost of the display area AA, and can be configured by connecting all of the intersecting points of the first touch metal TM_V and the second touch metal TM_H. However, the second touch electrode TE2 or the third touch electrode TE3 disposed at the lower side of the first touch electrode TE1 is required to have the second touch metal TM_H disposed thereon such that the second touch electrode TE2 or the third touch electrode TE3 is not connected to the first or second touch routing wire TRW1 or TRW2, respectively, connected with the touch electrode TE1 or TE2, respectively, disposed at the upper side of the second touch electrode TE2 or the third touch electrode TE3. Here, the upper and lower sides indicate upper and lower positions on a plane.

Hereinafter, arranging the second touch metal TM_H such that the touch routing wire TRW1 or TRW2 and the touch electrode TE are not connected with each other will be described.

Figure 7A:
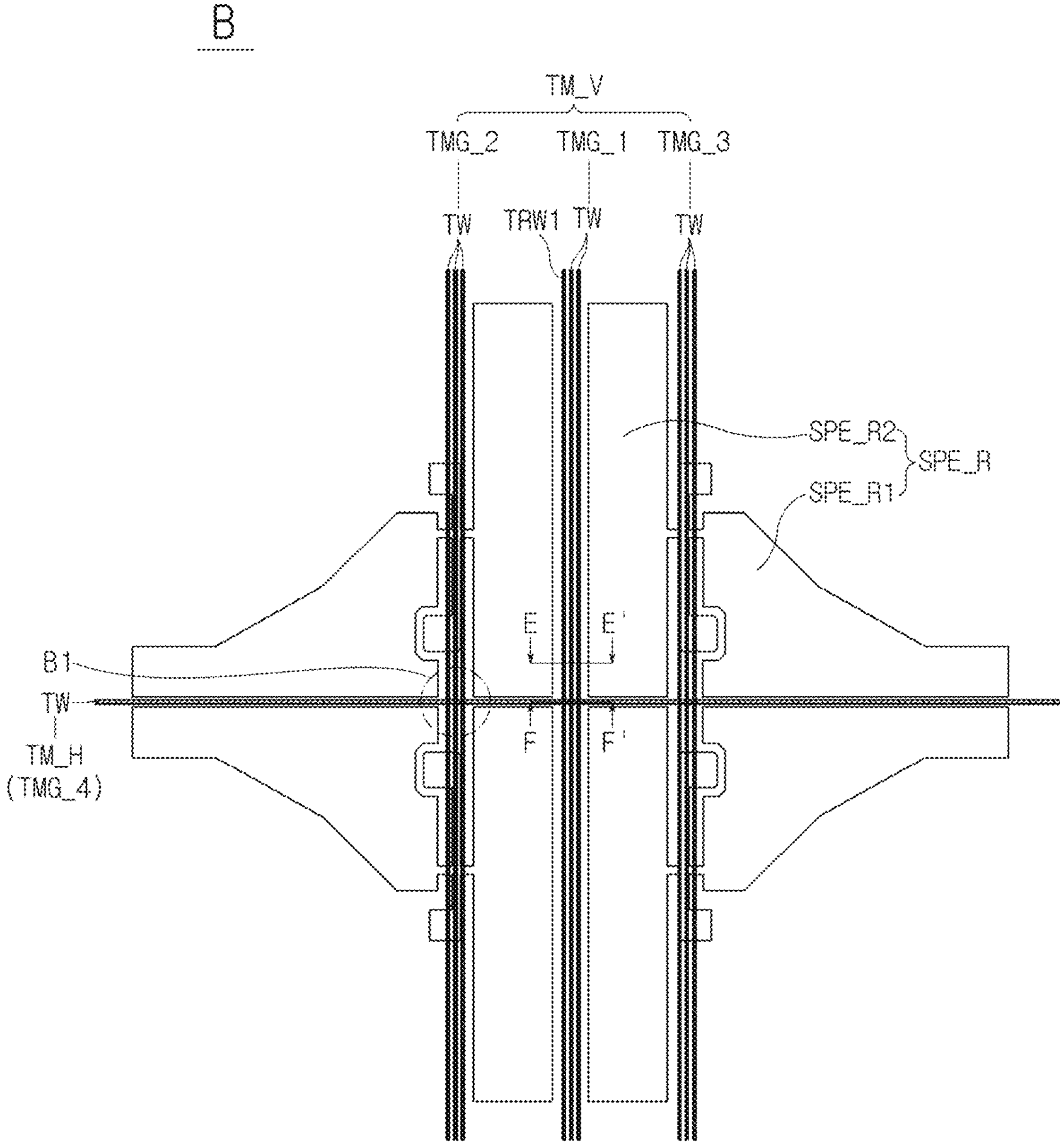
FIG. 7A and FIG. 7B illustrate a B part of a second touch electrode of FIG. 4A.
Figure 7B:
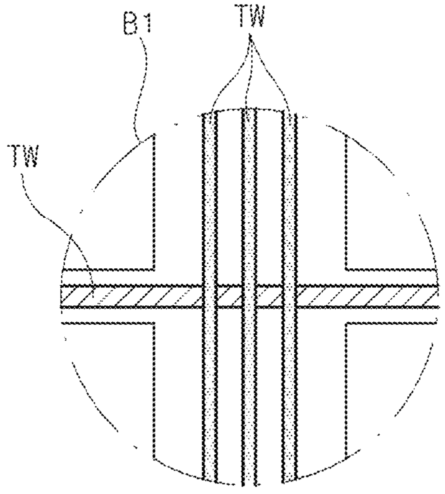

FIG. 7A illustrates a B part of the second touch electrode TE2 of FIG. 4A. FIG. 7B illustrates an enlarged of FIG. 7A. FIG. 7A illustrates an arrangement structure of the touch wire TW and the touch routing wire TRW disposed on one pixel electrode according to an embodiment of the present disclosure.

Figure 8A:
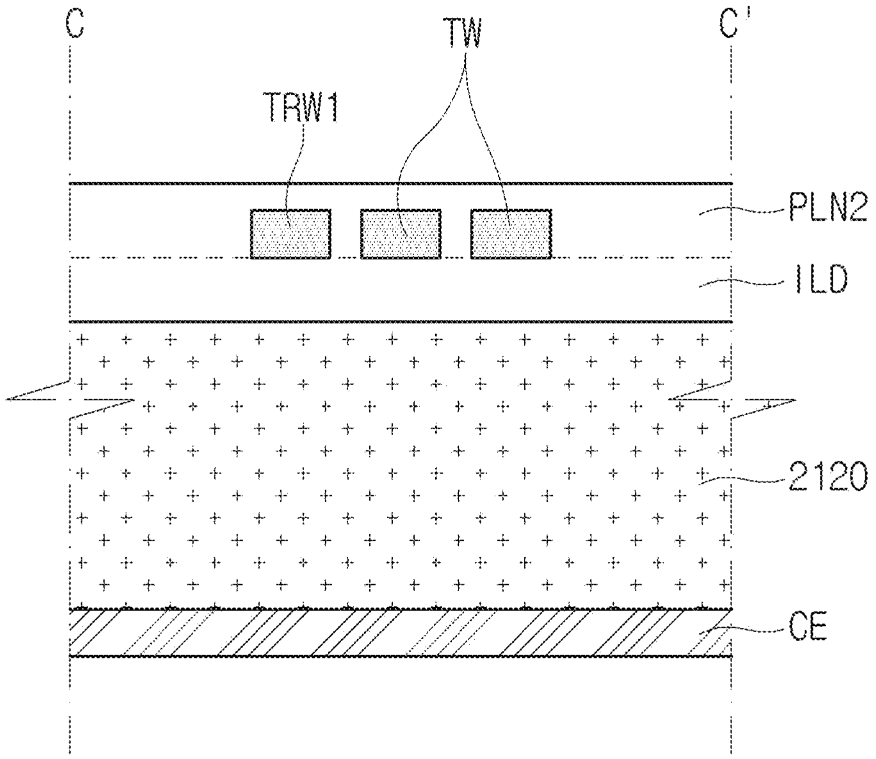
FIG. 8A is a sectional view taken along line E-E' of FIG. 7.

FIG. 8A is a sectional view taken along line E-E' of FIG. 7. FIG. 8A is the same as the sectional view taken along line C-C' of the A part of FIG. 5, so a detailed description thereof will be omitted herein or may be briefly provided.

Figure 8B:
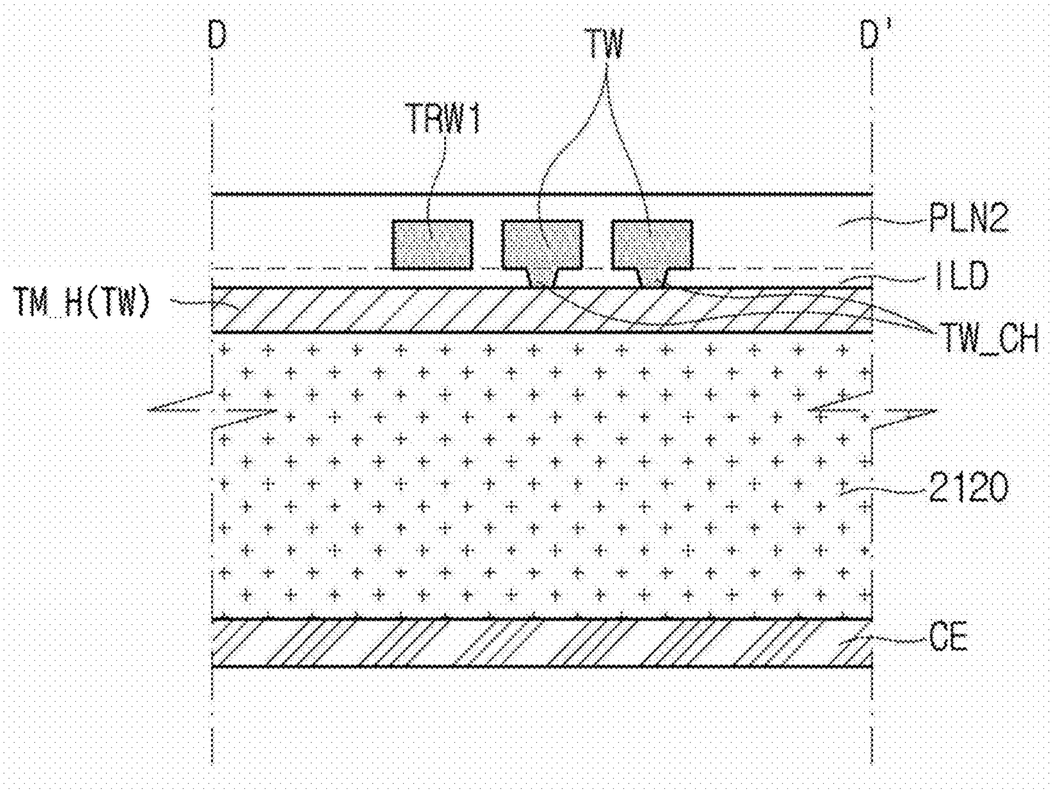
FIG. 8B is a sectional view taken along line F-F' of FIG. 7 according to a first embodiment of the present disclosure.
Figure 8C:
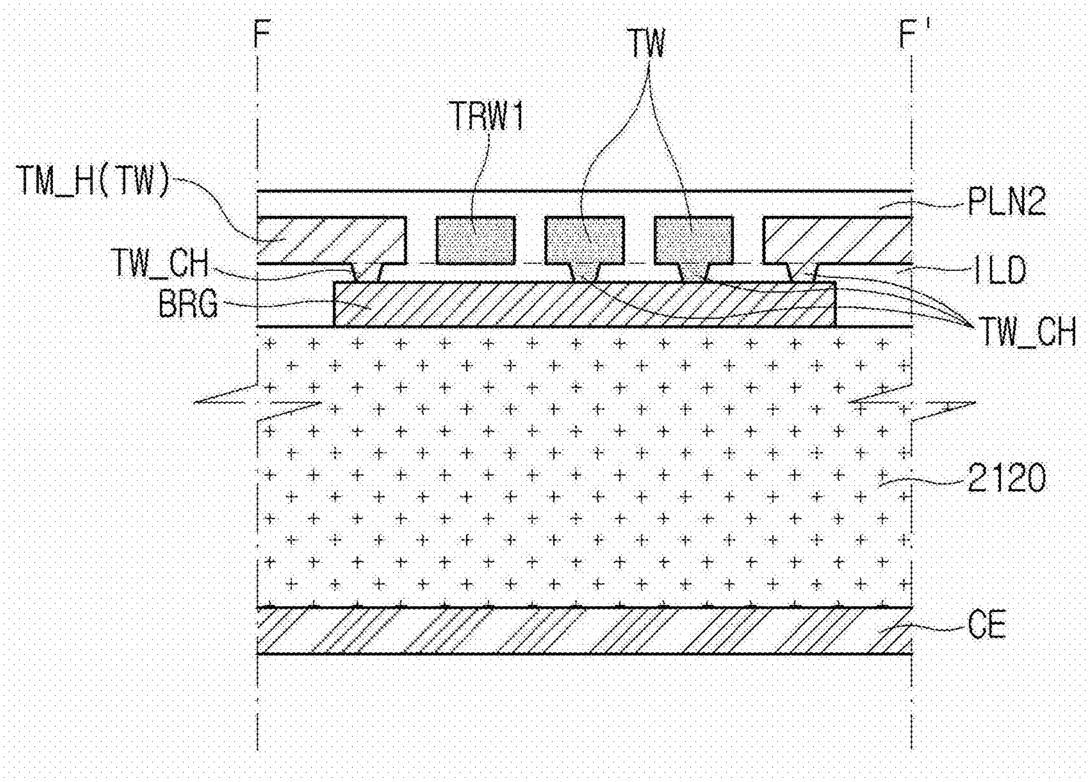
FIG. 8C is a sectional view taken along line F-F' of FIG. 7 according to a second embodiment of the present disclosure.

FIGS. 8B and 8C are sectional views taken along line F-F' of FIG. 7 according to embodiments of the present disclosure, respectively.

In present specification, the sectional views of a part at which the touch wire TW and the first touch routing wire TRW1 included in the first touch metal TM_V and the touch wire TW included in the second touch metal TM_H intersect with each other are illustrated in FIG. 8B and FIG. 8C according to the first and second embodiments, respectively, but are not limited thereto.

FIG. 8B illustrates a structure similar to the structure of FIG. 6B, the touch wire TW and the first touch routing wire TRW1 constituting the first touch metal TM_V are disposed on the interlayer insulation film ILD, and the touch wire TM_H(TW) constituting the second touch metal TM_H is disposed under the interlayer insulation film ILD, so the first touch routing wire TRW1 and the touch wire TM_H(TW) constituting the second touch metal TM_H are configured not to be connected with each other. In a case in which the touch wire hole TW-CH is not formed at a position at which the first touch routing wire TRW1 and the second touch electrode TE2 intersect with each other, the first touch routing wire TRW1 and the touch wire TM_H(TW) constituting the second touch metal TM_H are not connected with each other.

The structure illustrated in FIG. 8C is similar to the structure illustrated in FIG. 6C, and has the first touch metal TM_V and the second touch metal TM_H disposed on the same layer. When the first touch routing wire TRW1 included in the first touch metal TM_V and the touch wire TM_H(TW) included in the second touch metal TM_H are not connected with each other, a bridge BRG disposed on a layer different from a layer on which the first touch metal TM_V or the second touch metal TM_H is disposed can be formed. In FIG. 8C, the first touch routing wire TRW1 and the touch wire TW are disposed on the interlayer insulation film ILD, and the bridge BRG is disposed at the lower part of the interlayer insulation film ILD such that the first touch routing wire TRW1 and the touch wire TW and the bridge are disposed at layers different from each other, but such a configuration is not limited thereto.

A touch wire TM_H(TW) disposed at a part intersecting with the first touch routing wire TRW1 is removed such that the first touch routing wire TRW1 and the touch wire TM_H(TW) included in the second touch metal TM_H are not connected with each other, and a bridge BRG disposed under the removed part is connected with another touch wire TM_H(TW), so the first touch routing wire TRW1 and the second touch electrode TE2 can be separated from each other. The bridge BRG, the touch wire TW included in the first touch metal TM_V, and the touch wire TM_H(TW) included in the second touch metal TM_H can be connected with each other through the touch wire hole TW_CH.

Alternatively, the bridge BRG is formed under the first touch routing wire TRW1 included in the first touch metal TM_V such that the first touch routing wire TRW1 and second touch electrode the second touch electrode TE2 can be separated from each other.

The third touch electrode TE3 disposed under the second touch electrode TE2 can be formed to be separated from the first touch routing wire TRW1 and the second touch routing wire TRW2 according to the structure described above.

Figure 9:
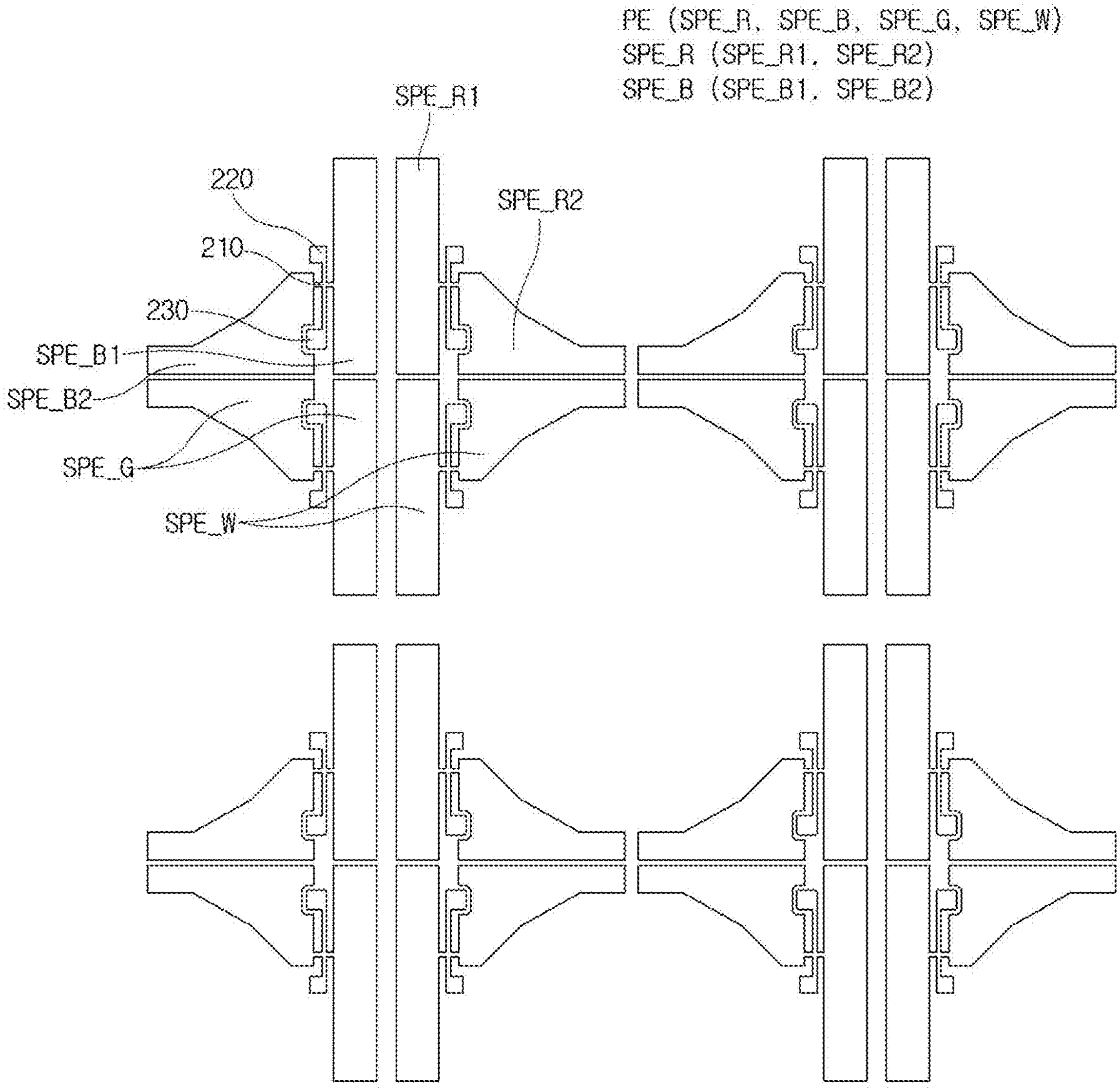
FIG. 9 illustrates an example of the pixel electrode according to the embodiment of the present disclosure.

FIG. 9 illustrates a pixel electrode according to an embodiment of the present disclosure.

The pixel electrode PE of FIG. 9 is a view enlarging the pixel electrode PE of FIG. 4A. The shape of the pixel electrode PE is not limited to the illustrated shape, and can be changed when required.

In FIG. 9, the pixel electrode PE includes a plurality of sub-pixel electrodes SPE configured to have different colors, and each of the plurality of sub-pixel electrodes SPE can be divided into a plurality of parts by the second touch metal group TMG_2 or the third touch metal group TMG_3. For example, each of the plurality of sub-pixel electrodes SPE can be divided into the first electrode part and the second electrode part. The red sub-pixel electrode SPE_R can be divided into the first electrode part SPE_R1 and the second electrode part SPE_R2, and the blue sub-pixel electrode SPE_B can be divided into the first electrode part SPE_B1 and the second electrode part SPE_B2. In the same manner, the green sub-pixel electrode SPE_G and the white sub-pixel electrode SPE_W can be divided. In a further example, each of the plurality of sub-pixel electrodes SPE can be divided into more than two parts.

The first electrode part SPE_R1 or SPE_B1 of the divided sub-pixel electrode can have a longer length in the first direction than in the second direction, and the second electrode part SPE_R2 or SPE_B2 can have a longer length in the second direction than in the first direction. The first touch metal TM_V is disposed along a periphery of a side of the first electrode part SPE_R1 or SPE_B1 having a longer length in the first direction, and thus when the first electrode part emits light, the first touch metal TM_V may not be seen by the light emitted and spread.

In addition, the second touch metal TM_H is disposed along a periphery of the second electrode part SPE_R2 or SPE_B2 long in the second direction, so when the second electrode part emits light, the second touch metal TM_H may not be seen by the light emitted and spread.

In other words, the touch metal is disposed between the electrode parts and is disposed above the electrode part. A light emitted from the electrode parts is directed up and spread, so that the touch metal may not be seen by spreading light.

In FIG. 9, the first electrode part SPE_R1 or SPE_B1 of the sub-pixel electrode is configured to have a rectangular shape, and the second electrode part SPE_R2 or SPE_B2 is configured to have a triangular shape, but the shape of each of the first electrode part and the second electrode part is not limited thereto.

The first electrode part SPE_R1 or SPE_B1 and the second electrode part SPE_R2 or SPE_B2 of the sub-pixel electrode can be driven by receiving voltage of the same drive transistor DRT. However, when the first electrode part SPE_R1 or SPE_B1 and the second electrode part SPE_R2 or SPE_B2 are configured to have different sizes, voltages applied to the first electrode part and the second electrode part can be different due to resistance difference according to the different sizes.

Accordingly, the intensity of light emitted by the first electrode part SPE_R1 or SPE_B1 and the second electrode part SPE_R2 or SPE_B2 can be different, and thus the display quality of the display device can deteriorate.

Accordingly, the first electrode part SPE_R1 or SPE_B1 and the second electrode part SPE_R2 or SPE_B2 of the sub-pixel electrode can be configured to have the same sizes, and light can be emitted from each of the electrode parts in the same manner, so the display quality of the display device can be maintained to be constant.

Due to process deviation or process margin, the sizes of the first electrode part SPE_R1 or SPE_B1 and the second electrode part SPE_R2 or SPE_B2 can be different from each other, but difference in sizes when between the first electrode part SPE_R1 or SPE_B1 and the second electrode part SPE_R2 or SPE_B2 is within 10%, it can be difficult to recognize difference in light emission due to voltage difference according to the different sizes.

In addition, a first light emitting part emitting light by corresponding to the first electrode part SPE_R1 or SPE_B1 of the sub-pixel electrode and a second light emitting part emitting light by corresponding to the second electrode part SPE_R2 or SPE_B2 can be configured to have the same sizes due to the first electrode part SPE_R1 or SPE_B1 and the second electrode part SPE_R2 or SPE_B2 having the same sizes.

Due to the process deviation or process margin, the sizes of the first light emitting part and the second light emitting part can be different from each other, but when difference in the sizes between the first light emitting part and the second light emitting part is within 10%, it can be difficult to recognize difference in light emissions of the first light emitting part and the second light emitting part.

The first electrode part SPE_R1 or SPE_B1 and the second electrode part SPE_R2 or SPE_B2 of the sub-pixel electrode can be connected to a sub-pixel connecting part

210. The sub-pixel connecting part 210 is a part configured to connect the first electrode part SPE_R1 or SPE_B1 and the second electrode part SPE_R2 or SPE_B2 of the sub-pixel electrode to each other and can be a part of the sub-pixel electrode SPE.

In addition, the display device can further include a transistor connecting part 230 and a repair part 220 protruding from the sub-pixel connecting part 210. The repair part 220, the sub-pixel connecting part 210, and the transistor connecting part 230 can be disposed in order or in reverse order in the same directions as the first touch metal TM_V. Accordingly, due to the touch wire included in the first touch metal TM_V, the transmission part and/or the light emitting part of the display device can be prevented from decreasing. In addition, due to the arrangement of the touch wire included in the first touch metal TM_V, the decrease of the transmittance can be reduced, and the RC change of the touch wire can be minimized. Accordingly, the display device having improved transmittance and touch sensitivity can be provided.

The transistor connecting part 230 can be connected with the drive transistor DRT configured to drive the plurality of sub-pixel electrodes SPE through the planarization layer hole PLN_CH. The drain electrode D of the drive transistor DRT corresponding to the sub-pixel electrode SPE is electrically connected to the transistor connecting part 230, and the same voltage can be applied to the first electrode part SPE_R1 or SPE_B1 and the second electrode part SPE_R2 or SPE_B2 of the sub-pixel electrode SPE.

The repair part 220 can be disposed on the drain electrode D connected to the drive transistor DRT of another sub-pixel electrode disposed adjacently to a specific sub-pixel electrode SPE. The specific sub-pixel electrode SPE can be connected to the transistor connecting part 230 and driven by one of the drive transistor DRT. The drive transistor DRT of another sub-pixel electrode disposed adjacently to a specific sub-pixel electrode SPE may be an adjacent drive transistor.

The repair part 220 can be electrically connected with the adjacent drive transistor.

The repair part 220 is configured to prevent damage to the sub-pixel electrode which can be caused by the structure of the sub-pixel electrode SPE divided into the first electrode part and the second electrode part, the sub-pixel electrode, and the detailed description of the repair part 220 will be described later.

As described above, each of the second touch metal group TMG_2 and the third touch metal group TMG_3 of the first touch metal TM_V can be disposed between the first electrode part SPE_R1 or SPE_B1 and the second electrode part SPE_R2 or SPE_B2 of the sub-pixel electrode, and can be disposed by overlapping the sub-pixel connecting part 210, the transistor connecting part 230, and the repair part 220.

The sub-pixel connecting part 210, the transistor connecting part 230, and the repair part 220 are non-light emitting parts, and although the touch metal overlaps and is disposed on the sub-pixel connecting part 210, the transistor connecting part 230, and the repair part 220, the light emitting part is not decreased.

Accordingly, the touch wire can be disposed rectilinearly to reduce the entire length of the touch wire, so the RC change of the touch wire can be minimized and thus the touch sensitivity can be improved. In addition, the length of the touch wire or the touch routing wire disposed in the transmission part can be minimized to improve the transmittance.

Figure 10:
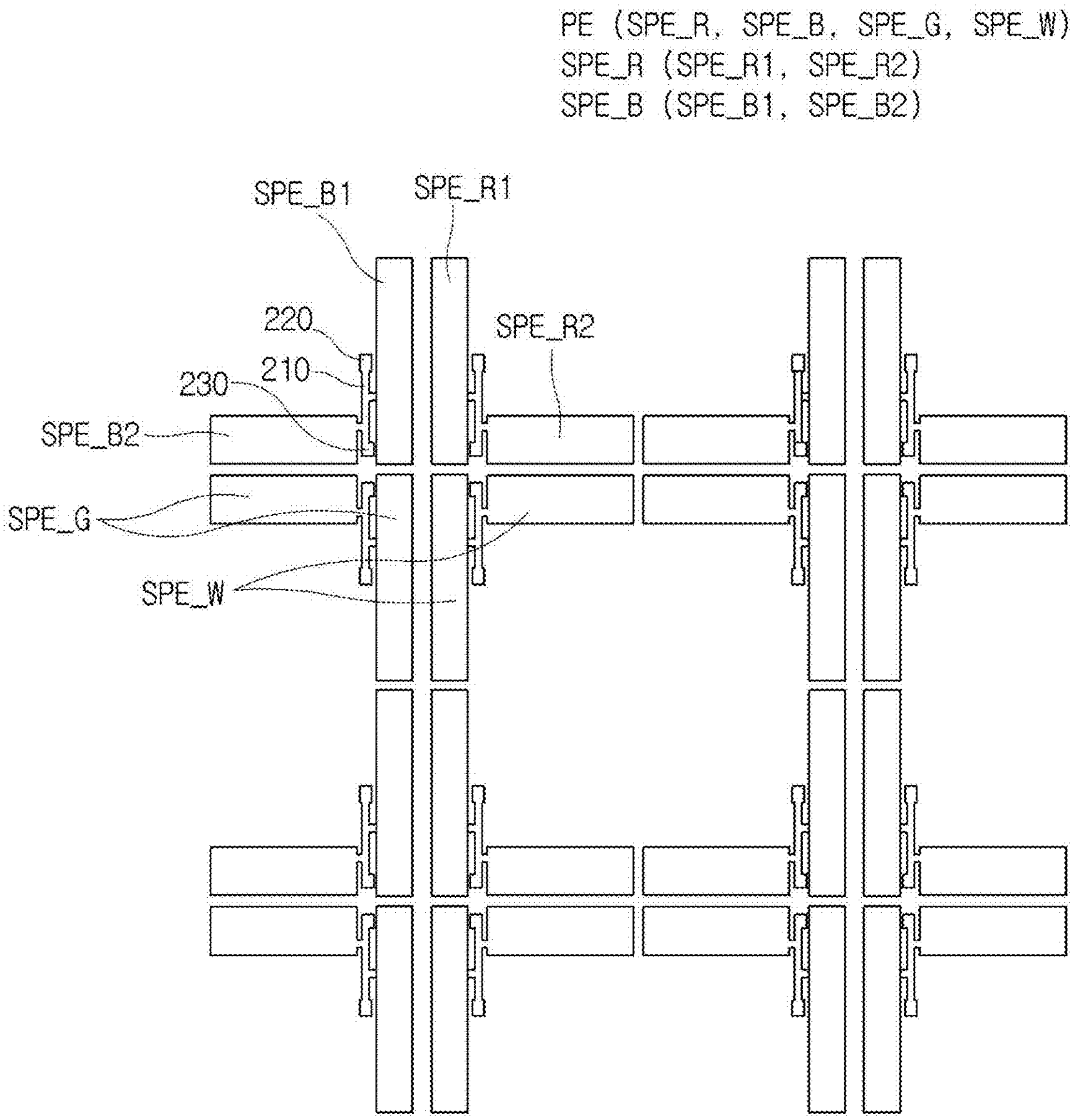
FIG. 10 illustrates an example of the pixel electrode according to the second embodiment of the present disclosure.

FIG. 10 illustrates pixel electrode PE according to another embodiment of the present disclosure.

As in FIG. 9, in the pixel electrode PE of FIG. 10, the first electrode part SPE_R1 or SPE_B1 of the sub-pixel electrode can be configured to have a longer length in the first direction than in the second direction, and the second electrode part SPE_R2 or SPE_B2 can be configured to have a longer length in the second direction than in the first direction. In FIG. 10, each of the first electrode part SPE_R1 or SPE_B1 and the second electrode part SPE_R2 or SPE_B2 of the sub-pixel electrode is configured to have a rectangular shape, and the pixel electrode PE is configured to have an L shape, but is not limited thereto.

In the structure of the pixel electrode PE of FIG. 10, the configurations of the sub-pixel electrode SPE, the sub-pixel connecting part 210, the transistor connecting part 230, and the repair part 220 can be configure to be the same as those of FIG. 9.

Figure 11:
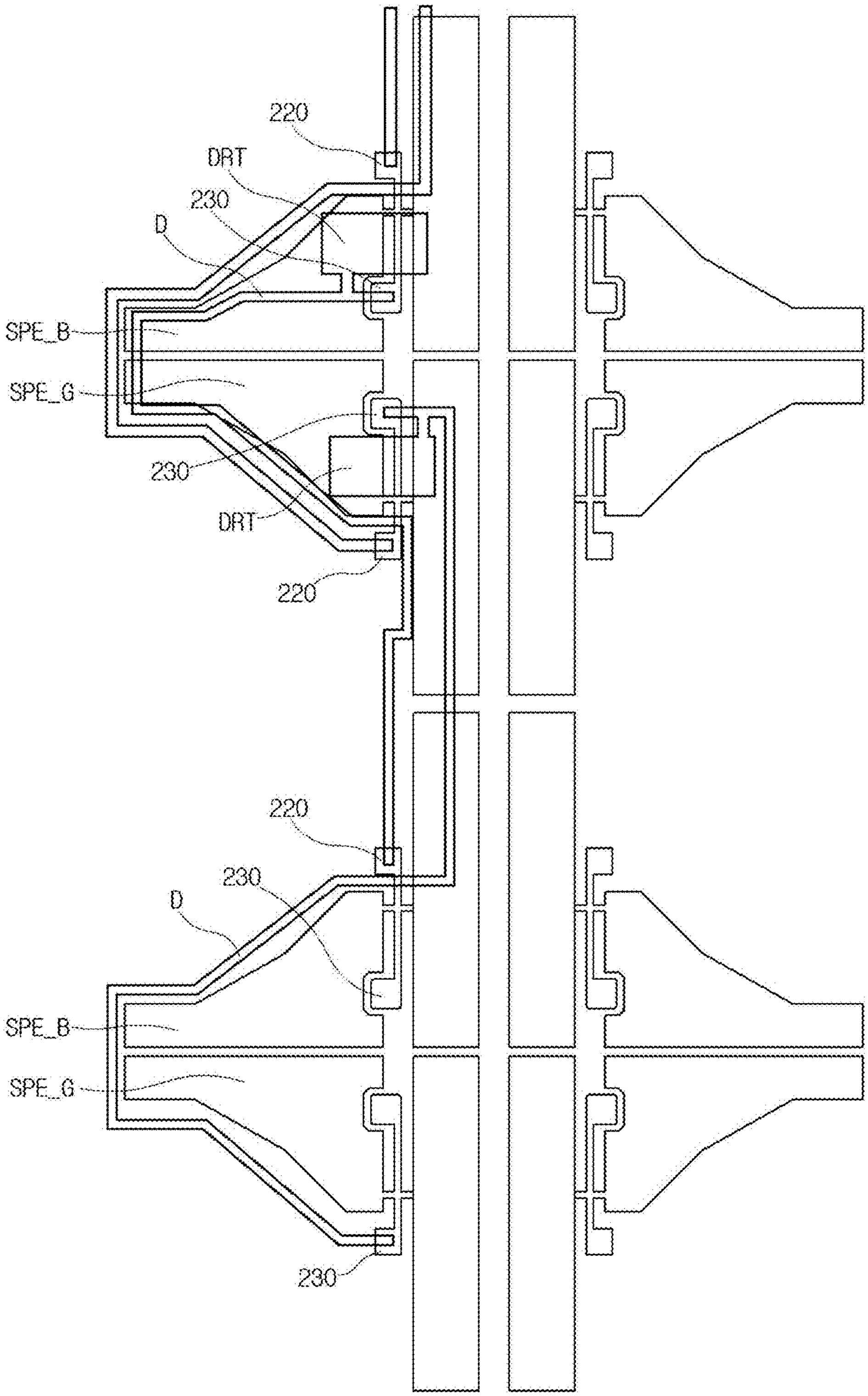
FIG. 11 illustrates a connection structure of a drive transistor and a sub-pixel electrode according to the embodiment of the present disclosure.

FIG. 11 illustrates a connection structure of the drive transistor and the sub-pixel electrode according to an embodiment of the present disclosure.

Each of the plurality of sub-pixel electrodes SPE is connected with the drive transistor DRT. The connecting of the sub-pixel electrode SPE with the drive transistor DRT can be performed in such a manner that the transistor connecting part 230 of the sub-pixel electrode SPE is extended and connected to the drive transistor DRT, or the drain electrode D of the drive transistor DRT is extended and connected to the sub-pixel electrode SPE. Since the source electrode S or the drain electrode D can be changed according to a transistor type, the drain electrode D can be the source electrode S.

Referring to FIG. 11, the drain electrode D of the drive transistor DRT can be extended and be connected to the sub-pixel electrode SPE. The extended drain electrode D can be a drain electrode D connected directly to the drive transistor DRT, and can be another drain electrode connected to an upper part of the drain electrode D.

The drain electrode D connected to the drive transistor DRT can be branched in a ‘T’ or ‘Y’ shape and can be extended. A first end or side of the branched part can be connected to the transistor connecting part 230, and a second end or side thereof can be connected to the repair part 220 of an adjacent sub-pixel electrode SPE. For example, the drain electrode D connected to the drive transistor DRT included in the blue sub-pixel electrode SPE_B disposed at the upper side of FIG. 11 is branched from the drive transistor DRT and a first end or side of the drain electrode D is connected to the transistor connecting part 230 of the blue sub-pixel electrode SPE_B, and a second end or side of the drain electrode D can overlap and be disposed at a lower part of a repair part 220 of another blue sub-pixel electrode SPE_B disposed under the blue sub-pixel electrode SPE_B. The drain electrode D and the transistor connecting part 230 can be connected with each other through the planarization layer hole PLN_CH.

The second end of the drain electrode D can overlap and be disposed on a lower part of a repair part 220 of a sub-pixel electrode SPE adjacent to each of the horizontal opposite sides and upper side of the blue sub-pixel electrode SPE_B in addition to on the lower part of the repair part of the another sub-pixel electrode SPE disposed under the blue sub-pixel electrode SPE_B, and can overlap and be disposed on a lower part of the repair part 220 of the sub-pixel electrode SPE_G, SPE_R, or SPE_W included in the same pixel electrode PE.

FIG. 11 illustrates the connection structure of two pixel electrodes PE, but the connection structure is not limited to the two pixel electrodes, and can be applied to all pixel electrodes PE.

The first planarization layer PLN1 is disposed between the drain electrode D disposed under the repair part 220 and the repair part 220, and the drain electrode D and the repair part 220 are not electrically connected with each other, but are not limited thereto. For example, the drain electrode D and the repair part 220 can be electrically connected with each other by a laser. For example, when the drive transistor DRT or the sub-pixel electrode SPE is damaged, the transistor connecting part 230 is electrically disconnected thereto and the repair part 220 is connected thereto such that the associated sub-pixel electrode SPE can be driven through a signal of an adjacent sub-pixel electrode SPE.

The display device according to an embodiment of the present disclosure can be described as follows.

A display device according to an embodiment of the present disclosure can include the plurality of light emitting parts disposed to correspond to the plurality of pixel electrodes disposed in the display area; the plurality of transmission parts disposed at a side of the plurality of light emitting parts; and the touch metal having the plurality of first touch metals extending in the first direction and the plurality of second touch metals extending in the second direction different from the first direction on the plurality of pixel electrodes. In addition, each of the plurality of pixel electrodes can include the plurality of sub-pixel electrodes, and each of the plurality of sub-pixel electrodes can be divided into the plurality of parts by a portion of the plurality of first touch metals.

According to some embodiment of the present disclosure, each of the plurality of sub-pixel electrodes includes the first electrode part and the second electrode part, the first electrode part and the second electrode part can be connected to the sub-pixel connecting part.

According to some embodiment of the present disclosure, the first electrode part can have a longer length in the first direction than in the second direction, and the second electrode part can have a longer length in the second direction than in the first direction.

According to some embodiment of the present disclosure, the plurality of light emitting parts can comprise the plurality of sub-light emitting parts disposed to correspond to the plurality of sub-pixel electrodes, and each of the plurality of sub-light emitting parts comprises a first light emitting part disposed to correspond to the first electrode part and a second light emitting part disposed by correspond to the second electrode part. In addition, sizes of the first light emitting part and the second light emitting part can be the same, or a difference between the size of the first light emitting part and the size of the second light emitting part can be within 10%.

According to some embodiment of the present disclosure, each of the plurality of pixel electrodes has one shape among a rhombus, a diamond, a cross, and a square, and the plurality of sub-pixel electrodes can include the red sub-pixel, the green sub-pixel, the blue sub-pixel, and the white sub-pixel.

According to some embodiment of the present disclosure, the plurality of transmission parts is surrounded by the light emitting parts. Each of the plurality of transmission parts can have one shape among a rhombus, a diamond, a square, an octagon, and a circle.

According to some embodiment of the present disclosure, the display device can further include the transistor connecting part and the repair part disposed between the first electrode part and the second electrode part and formed by protruding from the sub-pixel connecting part, and the transistor connecting part can be electrically connected with the drive transistor configured to drive the plurality of sub-pixel electrodes, and the repair part can be electrically connected with a drive transistor configured to drive other sub-pixel electrodes disposed adjacently to the drive transistor.

According to some embodiments of the present disclosure, the repair part can overlap and be disposed on the source electrode or drain electrode of the adjacent drive transistor configured to drive one of other sub-pixel electrodes disposed adjacently to the drive transistor.

According to some embodiment of the present disclosure, the repair part, the sub-pixel connecting part, and the transistor connecting part can be disposed in order or in reverse order in the first direction.

According to some embodiment of the present disclosure, the display device can further include the encapsulation layer and the cathode electrode disposed between the plurality of pixel electrodes and the plurality of first touch metals or the plurality of second touch metals, and the dam disposed at the periphery of the encapsulation layer and the touch pad part disposed at the outside of the light emitting part.

According to some embodiment of the present disclosure, each of the plurality of first touch metals includes a plurality of first touch metal group disposed between the plurality of sub-pixel electrodes disposed adjacently to each other in the second direction; a plurality of second touch metal group disposed at a first side (e.g., left side) of the first touch metal group and disposed between the first electrode part and the second electrode part included in the same sub-pixel electrode; and a third touch metal group disposed at a second side (e.g., right side) of the first touch metal group and disposed between the first electrode part and the second electrode part included in the same sub-pixel electrode, wherein each of the second touch metals can include a plurality of fourth touch metal group disposed between the sub-pixel electrodes disposed adjacently to each other in the first direction.

According to some embodiments of the present disclosure, at least one or more of the plurality of first touch metal group, the plurality of second touch metal group, the plurality of third touch metal group, and the plurality of fourth touch metal group can include at least three touch wires.

According to some embodiment of the present disclosure, the plurality of first touch metal groups, the plurality of second touch metal groups, the plurality of third touch metal groups, and the plurality of fourth touch metal groups can be connected with each other and constitute a plurality of touch electrodes, and the plurality of touch electrodes can be separated from each other.

According to an embodiment of the present disclosure, the plurality of first touch metal groups, the plurality of second touch metal groups, the plurality of third touch metal groups, and the plurality of fourth touch metal groups constituting the plurality of touch electrodes can be disposed on the same layer. At least one of touch wires constituting the plurality of first touch metal groups, the plurality of second touch metal groups, and the plurality of third touch metal groups can be a touch routing wire configured to electrically connect one of the plurality of touch electrodes with a touch sensing circuit. Another touch electrode separated from the one of the plurality of touch electrodes comprises a plurality of fourth touch metal groups comprising bridges.

According to some embodiments of the present disclosure, the plurality of first touch metal groups, the plurality of second touch metal groups, and the plurality of third touch metal groups constituting the plurality of touch electrodes are disposed on the same layer. The plurality of fourth touch metal groups are disposed on a layer different from the layer on which the plurality of first touch metal groups, the plurality of second touch metal groups, and the plurality of third touch metal groups are disposed. At least one of more of touch wires constituting the plurality of first touch metal groups, the plurality of second touch metal groups, and the plurality of third touch metal groups is a routing wire configured to electrically connect one of the plurality of touch electrodes with the touch sensing circuit, and the routing wire can be connected with at least one or more of the plurality of touch electrodes through the touch wire hole.

A display device according to an embodiment of the present disclosure includes: the plurality of light emitting parts disposed by corresponding to the plurality of pixel electrodes in the display area; the transmission part disposed at a side of each of the plurality of light emitting parts; and a touch metal including a plurality of first touch metals extending in the first direction and the plurality of second touch metals extending in the second direction different from the first direction on the plurality of pixel electrodes, and the plurality of pixel electrodes are composed of the plurality of sub-pixel electrodes, and a portion of the plurality of first touch metals can overlap and be disposed on the plurality of sub-pixel electrodes.

According to some embodiments of the present disclosure, the portion of the plurality of first touch metals can be disposed along the periphery of the plurality of sub-pixel electrodes.

According to some embodiments of the present disclosure, the portion of the plurality of first touch metals is disposed along the first direction between the plurality of sub-pixel electrodes adjacent to each other in the second direction in the plurality of sub-pixel electrodes. A portion of the plurality of second touch metals is disposed between the plurality of sub-pixel electrodes adjacent to each other in the first direction among the plurality of sub-pixel electrodes, and can be disposed along the second direction.

According to an embodiment of the present disclosure, the plurality of first touch metals and the plurality of second touch metals are connected with each other to constitute the touch electrode.

According to some embodiments of the present disclosure, each of the plurality of pixel electrodes can have one shape among a rhombus, a diamond, a cross, and a square, and each of the plurality of transmission parts can have one shape among a rhombus, a diamond, a square, an octagon, and a circle.

According to some embodiments of the present disclosure, the plurality of sub-pixel electrodes includes the first electrode part and the second electrode part. The sizes of the first electrode part and the second electrode part can be the same, or a difference between the size of the first electrode part and the size of the second electrode part can be within 10%. The first electrode part and the second electrode part can be connected to the sub-pixel connecting part.

Although the embodiments of the present disclosure have been described in more detail with reference to the accompanying drawings, the present disclosure is not necessarily limited to these embodiments, and various modifications can be made within the scope without departing from the technical spirit of the present disclosure. Accordingly, the embodiments disclosed in the present disclosure are not intended to limit the technical spirit of the present disclosure but to explain, and the scope of the technical spirit of the present disclosure is not limited by these embodiments. Therefore, it should be understood that the embodiments described above are illustrative in all respects and not restrictive. The protection scope of the present disclosure should be construed by the claims, and all technical ideas within the scope equivalent thereto should be construed as being included in the scope of the present disclosure.

What is claimed is:

1. A display device comprising:

a plurality of light emitting parts disposed by corresponding to a plurality of pixel electrodes located in a display area;

a plurality of transmission parts, each of which being disposed among the light emitting parts adjacent to each other; and a touch metal including a plurality of first touch metals extending in a first direction and a plurality of second touch metals extending in a second direction on the plurality of pixel electrodes, wherein each of the plurality of pixel electrodes comprises a plurality of sub-pixel electrodes, and each of the plurality of sub-pixel electrodes is divided into a plurality of parts, wherein a first portion of the plurality of first touch metals is disposed between the divided parts of the plurality of sub-pixel electrodes of a first pixel electrode of the plurality of pixel electrodes, and a second portion of the plurality of first touch metals is disposed between the divided parts of the plurality of sub-pixel electrodes of a second pixel electrode of the plurality of pixel electrodes disposed adjacent to the first pixel electrode in the second direction, and one of the plurality of second touch metals is disposed between the plurality of sub-pixel electrodes of a third pixel electrode of the plurality of pixel electrodes and the plurality of sub-pixel electrodes of a fourth pixel electrode of the plurality of pixel electrodes disposed adjacent to the third pixel electrode in the first direction.

2. The display device of claim 1, wherein each of the plurality of sub-pixel electrodes comprises a first electrode part and a second electrode part, and the first electrode part and the second electrode part are connected to a sub-pixel connecting part, and wherein a portion of the plurality of first touch metals is disposed above the sub-pixel connecting part.

3. The display device of claim 2, wherein the first electrode part has a longer length in the first direction than in the second direction, and the second electrode part has a longer length in the second direction than in the first direction.

4. The display device of claim 2, wherein the plurality of light emitting parts comprises a plurality of sub-light emitting parts disposed to correspond to the plurality of sub-pixel electrodes, each of the plurality of sub-light emitting parts comprises a first light emitting part disposed to correspond to the first electrode part and a second light emitting part disposed to correspond to the second electrode part, and sizes of the first light emitting part and the second light emitting part are the same, or, a difference between the size of the first light emitting part and the size of the second light emitting part is within 10%.

5. The display device of claim 2, further comprising:

a transistor connecting part and a repair part disposed between the first electrode part and the second electrode part by protruding from the sub-pixel connecting part, wherein the transistor connecting part is electrically connected with a drive transistor configured to drive one of the plurality of sub-pixel electrodes, and the repair part is electrically connected with an adjacent drive transistor configured to drive one of other sub-pixel electrodes disposed adjacently to the drive transistor.

6. The display device of claim 5, wherein the repair part overlaps and is disposed on a source electrode or a drain electrode of the adjacent drive transistor configured to drive one of the other sub-pixel electrodes adjacently to the drive transistor.

7. The display device of claim 5, wherein the repair part, the sub-pixel connecting part, and the transistor connecting part are disposed in order or in reverse order in the first direction.

8. The display device of claim 2, wherein each of the plurality of first touch metals comprises:

a first touch metal group disposed between the plurality of sub-pixel electrodes disposed adjacently to each other in the second direction;

a second touch metal group disposed at a first side of the first touch metal group and disposed between the first electrode part and the second electrode part included in one same sub-pixel electrode of the plurality of sub-pixel electrodes; and a third touch metal group disposed at a second side of the first touch metal group and disposed between the first electrode part and the second electrode part included in another same sub-pixel electrode of the plurality of sub-pixel electrodes, wherein each of the second touch metals comprises a fourth touch metal group disposed between two sub-pixel electrodes disposed adjacently to each other in the first direction among the sub-pixel electrodes.

9. The display device of claim 8, wherein at least one of the first touch metal group, the second touch metal group, the third touch metal group, and the fourth touch metal group comprises at least three touch wires.

10. The display device of claim 8, wherein the first touch metal group, the second touch metal group, the third touch metal group, and the fourth touch metal group constitute a plurality of touch electrodes.

11. The display device of claim 1, wherein each of the plurality of pixel electrodes has one shape among a rhombus, a diamond, a cross, and a square, and the plurality of sub-pixel electrodes include a red sub-pixel, a green sub-pixel, a blue sub-pixel, and a white sub-pixel.

12. The display device of claim 1, wherein each of the plurality of transmission parts is surrounded by at least some of the plurality of light emitting parts, and each of the plurality of transmission parts has one shape among a rhombus, a diamond, a square, an octagon, and a circle.

13. The display device of claim 1, further comprising:

an encapsulation layer, a cathode electrode disposed between the plurality of pixel electrodes and the plurality of first touch metals or the plurality of second touch metals, a dam disposed at a periphery of the encapsulation layer, and a touch pad part disposed at outside of an outermost light emitting part among the plurality of light emitting parts.

* * * * *